United States Patent
Salmon

(10) Patent No.: US 7,615,478 B2
(45) Date of Patent: Nov. 10, 2009

(54) FABRICATION METHOD FOR ELECTRONIC SYSTEM MODULES

(75) Inventor: Peter C. Salmon, Mountain View, CA (US)

(73) Assignee: Hynix Semiconductor Inc., Seoul (KR)

( * ) Notice: Subject to any disclaimer, the term of this patent is extended or adjusted under 35 U.S.C. 154(b) by 152 days.

(21) Appl. No.: 11/769,321

(22) Filed: Jun. 27, 2007

(65) Prior Publication Data

US 2007/0245554 A1    Oct. 25, 2007

Related U.S. Application Data

(63) Continuation of application No. 10/702,235, filed on Nov. 5, 2003, now Pat. No. 7,297,572, which is a continuation-in-part of application No. 10/237,640, filed on Sep. 6, 2002, now Pat. No. 6,927,471.

(60) Provisional application No. 60/318,271, filed on Sep. 7, 2001.

(51) Int. Cl.
   *H01L 21/44* (2006.01)
(52) U.S. Cl. ............................... 438/612
(58) Field of Classification Search ............ 257/778, 257/698; 216/20; 438/612, 613, 618, 619
   See application file for complete search history.

(56) References Cited

U.S. PATENT DOCUMENTS

| 4,672,421 A | 6/1987 | Lin |
| 4,767,189 A | 8/1988 | Hayashi et al. |

(Continued)

FOREIGN PATENT DOCUMENTS

EP    1089331 A2    4/2001

(Continued)

OTHER PUBLICATIONS

Davis et al., "Thin Film Metallization of Three Dimensional Substrates," May 1-4, 1994, Electronic Components Technology Conference, Proceedings 44th, pp. 359-361.

(Continued)

*Primary Examiner*—Leonardo Andújar
*Assistant Examiner*—Monica D Harrison
(74) *Attorney, Agent, or Firm*—Townsend and Townsend and Crew LLP

(57) ABSTRACT

This specification describes techniques for manufacturing an electronic system module. The module includes flexible multi-layer interconnection circuits with trace widths as narrow as 5 microns or less. A glass panel manufacturing facility, similar to those employed for making liquid crystal display, LCD, panels is preferably used to fabricate the interconnection circuits. A multi-layer interconnection circuit is fabricated on the glass panel using a release layer. A special assembly layer is formed over the interconnection circuit comprising a thick dielectric layer with openings formed at input/output (I/O) pad locations. Solder paste is deposited in the openings using a squeegee to form wells filled with solder. IC chips are provided with gold stud bumps at I/O pad locations, and these bumps are inserted in the wells to form flip chip connections. The IC chips are tested and reworked. The same bump/well connections can be used to attach fine-pitch cables. Module packaging layers are provided for hermetic sealing and for electromagnetic shielding. A blade server or supercomputer embodiment is also described.

13 Claims, 19 Drawing Sheets

U.S. PATENT DOCUMENTS

| | | | |
|---|---|---|---|
| 4,862,322 A | | 8/1989 | Bickford et al. |
| 5,024,372 A | | 6/1991 | Altman et al. |
| 5,074,947 A | | 12/1991 | Estes et al. |
| 5,103,290 A | * | 4/1992 | Temple et al. ............... 257/698 |
| 5,214,250 A | | 5/1993 | Cayson et al. |
| 5,267,867 A | | 12/1993 | Agahdel et al. |
| 5,290,970 A | | 3/1994 | Currie |
| 5,367,593 A | | 11/1994 | Lebby et al. |
| 5,382,545 A | | 1/1995 | Hong |
| 5,404,175 A | | 4/1995 | Nagae et al. |
| 5,534,465 A | | 7/1996 | Frye et al. |
| 5,534,466 A | * | 7/1996 | Perfecto et al. ............... 216/20 |
| 5,550,083 A | | 8/1996 | Koide et al. |
| 5,579,574 A | | 12/1996 | Colleran et al. |
| 5,627,406 A | | 5/1997 | Pace |
| 5,700,737 A | | 12/1997 | Yu et al. |
| 5,841,193 A | | 11/1998 | Eichelberger |
| 5,912,510 A | * | 6/1999 | Hwang et al. ............... 257/778 |
| 5,918,364 A | | 7/1999 | Kulesza et al. |
| 5,972,152 A | | 10/1999 | Lake et al. |
| 5,998,738 A | | 12/1999 | Li et al. |
| 6,103,554 A | | 8/2000 | Son et al. |
| 6,138,348 A | | 10/2000 | Kulesza et al. |
| 6,141,245 A | | 10/2000 | Bertin et al. |
| 6,174,804 B1 | | 1/2001 | Hsu |
| 6,175,161 B1 | | 1/2001 | Goetz et al. |
| 6,180,687 B1 | | 1/2001 | Hammer et al. |
| 6,180,867 B1 | | 1/2001 | Hedengren et al. |
| 6,246,010 B1 | | 6/2001 | Zenner et al. |
| 6,329,610 B1 | | 12/2001 | Takubo et al. |
| 6,372,549 B2 | | 4/2002 | Urushima |
| 6,515,870 B1 | | 2/2003 | Skinner et al. |
| 6,528,891 B2 | | 3/2003 | Lin |
| 6,664,176 B2 | | 12/2003 | Hedler et al. |
| 6,846,737 B1 | | 1/2005 | Towle et al. |
| 6,881,609 B2 | | 4/2005 | Salmon |
| 6,927,471 B2 | | 8/2005 | Salmon |
| 7,297,572 B2 | | 11/2007 | Salmon |
| 2001/0020549 A1 | | 9/2001 | Horiuchi et al. |
| 2001/0026010 A1 | | 10/2001 | Horiuchi et al. |
| 2001/0046586 A1 | | 11/2001 | Chan et al. |
| 2002/0151164 A1 | | 10/2002 | Jiang et al. |

FOREIGN PATENT DOCUMENTS

| | | |
|---|---|---|
| JP | 07169873 A | 7/1995 |
| WO | WO 91/09419 | 6/1991 |
| WO | WO 92/07378 | 4/1992 |
| WO | WO 95/05675 | 2/1995 |

OTHER PUBLICATIONS

U.S. Appl. No. 10/237,640, filed Sep. 6, 2002, now Patent No. 6,627,471, Office Action mailed Oct. 5, 2004.
U.S. Appl. No. 10/237,640, filed Sep. 6, 2002, now Patent No. 6,627,471, Applicant Response to Office Action received by the USPTO on Jan. 24, 2005.
U.S. Appl. No. 10/237,640, filed Sep. 6, 2002, now Patent No. 6,627,471, Notice of Allowance mailed Apr. 15, 2005.
U.S. Appl. No. 10/701,888, filed Nov. 4, 2003, now Patent No. 6,881,609, Office Action mailed May 21, 2004.
U.S. Appl. No. 10/701,888, filed Nov. 4, 2003, now Patent No. 6,881,609, Applicant Response to Office Action received by the USPTO on Aug. 30, 2004.
U.S. Appl. No. 10/701,888, filed Nov. 4, 2003, now Patent No. 6,881,609, Notice of Allowance mailed Dec. 9, 2004.
U.S. Appl. No. 10/702,235, filed Nov. 5, 2003, Restriction Requirement mailed Jun. 28, 2005.
U.S. Appl. No. 10/702,235, filed Nov. 5, 2003, Applicant Response to Restriction Requirement received by the USPTO on Aug. 5, 2005.
U.S. Appl. No. 10/702,235, filed Nov. 5, 2003, Office Action mailed Oct. 3, 2005.
U.S. Appl. No. 10/702,235, filed Nov. 5, 2003, Applicant Response to Office Action received by the USPTO on Apr. 7, 2006.
U.S. Appl. No. 10/702,235, filed Nov. 05, 2003, Office Action mailed Dec. 15, 2006.
U.S. Appl. No. 10/702,235, filed Nov. 5, 2003, Applicant Response to Office Action received by the USPTO on Jun. 15, 2007.
U.S. Appl. No. 11/066,964, filed Feb. 25, 2005, Restriction Requirement mailed Jun. 5, 2007.
U.S. Appl. No. 11/066,964, filed Feb. 25, 2005, Applicant Response to Office Action received by the USPTO on Jul. 16, 2007.
U.S. Appl. No. 11/066,964, filed Feb. 25, 2005, Office Action mailed Jul. 8, 2008.
Notice of Allowance For U.S. Appl. No. 10/702,235 Mailed Jul. 24, 2007.
Restriction Requirement Mailed Mar. 30, 2006 For U.S. Appl. No. 11/066,964.
Response to Restriction Requirement Received by the USPTO on Apr. 17, 2006 For U.S. Appl. No. 11/066,964.
Restriction Requirement Mailed Jun. 30, 2006 For U.S. Appl. No. 11/066,964.
Response to Restriction Requirement Received by the USPTO on Nov. 2, 2006 For U.S. Appl. No. 11/066,964.
Notice of Non-Complaint Amendment Mailed Jan. 30, 2007 For U.S. Appl. No. 11/066,964.
Response to Notice of Non-Complaint Amendment Received by the USPTO on Mar. 9, 2007 For U.S. Appl. No. 11/066,964.
Non-Final Office Action For U.S. Appl. No. 11/066,964 Mailed Oct. 9, 2007.
Response to Office Action Received by the USPTO on Mar. 28, 2008 For U.S. Appl. No. 11/066,964.
Response to Final Office Action Received by the USPTO on Sep. 18, 2008 For U.S. Appl. No. 11/066,964.
Requirement for Restriction/Election for U.S. Appl. No. 10/237,640, mailed Jun. 15, 2004, 5 pages.
Response to Requirement for Restriction/Election for U.S. Appl. No. 10/237,640, Received by the USPTO on Jul. 12, 2004, 2 pages.
Non-Final Office Action for U.S. Appl. No. 11/066,964, mailed Oct. 30, 2008, 5 pages.
Requirement for Restriction/Election for U.S. Appl. No. 11/868,912, mailed Mar. 13, 2009, 7 pages.
Response to Requirement for Restriction/Election for U.S. Appl. No. 11/868,912, mailed Apr. 10, 2009, 8 pages.
Non-Final Office Action for U.S. Appl. No. 11/868,912 Mailed Jun. 18, 2009, 16 pages.
Non-Final Office Action for U.S. Appl. No. 11/868,919 Mailed Apr. 28, 2009, 32 pages.

* cited by examiner

FABRICATION METHOD FOR ELECTRONIC SYSTEM MODULES

RELATED APPLICATIONS

This application is a continuation-in-part of application Ser. No. 10/237,640 filed Sep. 6, 2002 which claims priority to Provisional Application Ser. No. 60/318,271 filed Sep. 7, 2001.

BACKGROUND OF THE INVENTION

1. Field of the Invention

This invention relates generally to connections between components, and more particularly to connection arrays where each connection in the array includes a bump inserted into a well containing bonding material.

2. Description of the Related Art

The number of input/output (I/O) connections required by integrated circuit (IC) chips is increasing, to several hundred for recent microprocessor chips. As verification of complex designs becomes an increasing portion of the total design activity, it is desirable to increase the I/O count further, to provide access to more internal nodes for testing. Flip chip assembly methods have helped to provide more I/O connections because they provide an area array of connections across the entire face of an IC chip, rather than just at the perimeter as with wire bonding. However, even with flip chip assembly it continues to be desirable to reduce the pad pitch, the distance between bonding pad centers, in order to achieve more I/O connections per unit area of IC chip.

A recent advance in flip chip assembly capability has been the introduction of stud bumping machines that can provide gold stud bumps on IC chips with pad pitches of less than 100 microns. However, to take advantage of this capability, the system board or package that receives the bumped devices must have fine traces in order to route all of the signals in the space available with not too many layers, plus it must support bonding pad pitches less than 100 microns. The most recent packaging technology to be commercially introduced is called land grid array, LGA. It builds up the wiring layers by plating a base layer of copper that has been patterned with photo resist. The external terminal pitch claimed for this packaging method is "less than 0.5 mm". This is not sufficient for direct bonding of IC chips; in fact none of the available printed circuit board technologies can support direct mounting of bumped devices at a pitch of 100 microns or less. The current invention is capable of pad pitches of less than 100 microns without using any redistribution wiring layers; it also includes a viable method for reworking defective IC chips at this bonding density.

Indium-based solders have been developed that form reliable bonds with gold structures such as stud bumps. An example is Indalloy 290 available from Indium Corporation of America, Utica, N.Y. This alloy contains 97% indium and 3% silver and melts at 143° C. Since the solubility of gold in this solder is very low, brittle inter-metallic compounds are not a significant problem, and the integrity of a gold stud bump can be maintained through multiple rework cycles.

For many years the minimum trace width available from printed circuit board vendors has been around 100 microns using glass epoxy laminates. Recently, Unitive, Inc. of Research Triangle Park, N.C. USA, has produced interconnection circuits using a spin-on dielectric called BCB (benzocyclobutene) having a copper trace width of 12 microns and a space between traces of 13 microns. The current invention preferably uses aluminum conductors and BCB dielectric and is capable of achieving trace widths of 5 microns or less, together with a trace pitch of 10 microns or less. These fine aluminum traces are well suited for low power and low frequency applications. Higher current applications may use thicker and wider traces, and may substitute copper for aluminum. High frequency applications can employ the methods described herein if additional effort is applied to form traces with controlled impedance; for example, if differential pairs and ground reference planes are employed the frequency range may be extended to the order of 1 GHz, depending on trace lengths and other specifics of the application.

One way to achieve fine line interconnection circuits is to employ a semiconductor fabrication facility and to build the interconnection circuit on a silicon wafer, hence the term, wafer level packaging, WLP. The precision of the associated photolithographic methods, the clean room environment with low particulate count, and the advanced substrate handling equipment of such a facility can all contribute to high-density interconnection circuits. However, the application of IC chip manufacturing facilities to this problem is more than what is required. An intermediate alternative is to apply the manufacturing resources of a glass panel fabrication facility, where the minimum feature sizes are 10 to 20 times larger than for IC chips (but still adequate for the most advanced assembly processes), and the manufacturing cost per unit area is less than 5% of the cost per unit area of IC chips. In addition, the glass panel fabrication facility can produce system boards of any size up to around two meters on a side for the latest panel fabrication facilities, whereas the largest wafers produced have a diameter of 300 mm.

In order to avoid the rigidity and weight of the glass substrate, and to provide better thermal access to the heat producing components for cooling them, it is usually preferable to discard the glass carrier after most of the processing is done.

Typically, the fine trace capability of WLP has been used to create redistribution circuits that map from the fine pitch available with flip chip bonding to the coarser pitch of a printed circuit board. The current invention eliminates the redistribution circuits because the printed circuits produced (termed interconnection circuits) include fine features that easily accommodate the fine pitch of the flip chip bonding.

Power supply voltages and signal voltage swings are reducing with each new generation of IC chip technology. To achieve the necessary noise margins during testing it is generally necessary to connect test points to test circuits using short leads. This is typically achieved by employing a test head that is located close to the test points. The test head provides a set of pin electronics for each signal tested; the pin electronics typically include high-speed sampling circuits and comparator circuits, along with matrix switches and relays to map test points to test pins. Providing test chips on the motherboard (system board) is another way to achieve high speed functional testing. The test chip or chips can be placed close to system buses for sampling signal activity at high speed, and this test method is recommended for electronic modules of the current invention. Said test chips incorporate high speed sampling circuits and comparators; they work in concert with a test support computer that is cabled to the system and communicates with the test chips and the system at relatively low data rates. More accurate and complete testing of components is provided when they are tested in their real system environment rather than being tested as individual components using test vectors that represent a simulation of the system environment. The system environment is preferably created with the actual system running a test version of the system's application code, programmed in the language of the application rather than a special test language. This way, the system architects can also be the test architects. This can lead to improvements in test development time, test effectiveness and cost, compared with the conventional approach that includes a test program in a specialized test language, simulated test vectors, and a general-purpose tester. This test method provides focus on the system level requirements, as opposed to component level requirements. If the system level requirements are satisfactorily met, then the minutiae of component level characteristics become irrelevant. Alternatively stated, only the functions relevant to proper system function are tested; this is a much more manageable set of requirements than the total set of functions that all the assembled components are capable of performing.

If necessary, multiple IC chips may be employed to test the entire range of digital, analog, and RF functions of a particular product. Adding these chips to the system using the current invention is not as expensive as in the past because the test chips will be manufactured in volume and will have low unit costs, and the packaging and assembly cost will be minimal, as will be further discussed. In summary, a mini-tester may be included with every module produced, but the cost of this tester may be well justified by the system level assembly and performance benefits, and the reduction in system development time.

Module verification can be performed at an elevated temperature by heating the glass carrier underneath the module (circuit assembly or assembled system board). By providing a pre-determined test temperature to the entire circuit assembly, a speed grade can be associated with the module, as has been done in the past at the component level. Greater emphasis can be placed on environmental stress testing at the module level. Accelerated life testing can also be performed early in the life cycle of a product, and lessons learned about particular components can be incorporated into the module level test.

R. K. Traeger,"Hermeticity of Polymeric Lid Sealants", Proc. $25^{th}$ Electronics Components Conf., 1976, p. 361, has documented the water permeabilities of silicones, epoxies, fluorocarbons, glasses and metals. Traeger's data shows that, in terms of providing a barrier to water, a layer of metal that is 1 micron thick is approximately equivalent to a layer of glass that is 1 mm thick, and also equivalent to a layer of epoxy that is 100 cm thick. Hermetic packaging techniques and electromagnetic shielding techniques can be applied at the module level to improve both performance and manufacturing cost. The current invention describes a method for fabricating a metal envelope that encloses almost-the entire module, substantially attenuating the interference from individual components and the wiring between them. Cost can be reduced because hermeticity and shielding are provided with a simple process applied once to the entire system, rather than being addressed individually at each of the components.

Such a complete module or system fabrication process can be achieved if a panel fabrication facility is applied to the complete set of module manufacturing steps, including high-density cables and connectors and back-end processing for hermeticity and shielding. Sub-processes for the following structural elements are included: multi-layer interconnection circuits; a special assembly layer that may be required for direct attachment of IC chips (wells filled with solder at each I/O pad); module access ports (arrays of test points and system interconnects having wells filled with solder at each I/O pad); module access cables or test fixtures for connecting between the module access ports and external systems; and the back end module layers that provide both hermeticity and electromagnetic shielding.

Usually structures for direct chip attach require an epoxy under-layer between direct mounted IC chips (flip chips) and the package or circuit board. The purpose of the under-layer is to provide mechanical strength to withstand repeated thermal cycling without developing cracks in the area of the flip chip bonds. The thermal stress typically arises because of differences in coefficients of thermal expansion (CTEs) between the IC chip material and the board material. Gelatinized solvents have been used to dissolve the epoxy during rework of defective chips; they typically leave a residue that must be cleaned off. The process of cleaning off the epoxy and the residue has often resulted in damage to the fine pitch bonding leads, to the point where they cannot be reliably re-bonded. This under-layer is unnecessary with the current invention because mechanical strength is provided at each bond by the physical structure of a stud bump mated with a well filled with solder. Also the final interconnection circuit is flexible so that thermally induced stresses are substantially eliminated in the region of the flip chip bonds. Without the thermally induced stress, no cracking will occur. Thermal stresses are still present during assembly (because the carrier/interconnection circuit is rigid at this point), but are avoided during operation in the field (when the carrier is removed and the interconnection circuit is flexible). The number and extent of thermal cycles endured during assembly are more predictable and controllable than thermal cycles arising from operation in the field. Stress testing in the laboratory can be used to quantify the acceptable temperature limits, and assure crack-free circuit assemblies. However, using the proposed flip chip assembly method, it may be necessary to limit the maximum size of IC chips assembled, to limit the maximum strain induced by thermal mismatch during assembly.

Replacement of defective chips (rework) is much easier if there is no epoxy under layer to be removed. Also, in the preferred embodiment there are no delicate traces to be damaged during rework because each I/O pad is provided with a well filled with solder, as will be further described. Attaching IC chips onto flexible substrates is referred to in the art as"compliant packaging".

SUMMARY OF THE INVENTION

A glass substrate for $5^{th}$ generation fabrication of LCD circuits is typically 1100 by 1250 mm in area, and 0.7 mm or 1.1 mm thick, which can be used in carrying out the present invention. However, the glass carrier of the current invention can be of any size. The unit manufacturing costs of interconnection circuits and related circuit structures of the current invention are lower if larger glass panels are used. The glass or other rigid carrier provides mechanical support for all of the fabrication, component assembly, cable assembly, test, and rework process steps, and also has excellent dimensional stability. This dimensional stability transfers to the multi-layer interconnection circuits that are built up as a series of films on top of the glass. This transferred dimensional stability is a primary reason that fine line features such as trace width and space of 5 microns are possible with the current invention. It is also important however, that the final version of the interconnection circuit be flexible, because this flexibility allows the use of an epoxy under layer to be avoided, leading to more robust rework processes for removing and replacing defective chips. The flexibility also allows system boards to be folded in compact devices such as cellular phones. Folding requires that the chips be arranged in rows, and the clear area between rows becomes a potential folding line.

A release agent is applied to a glass panel substrate, except for a clear region near the edges. The clear region is characterized by high adhesion between the glass and the polymer base layer to be subsequently formed on the glass. The high adhesion region provides an anchor that firmly attaches the polymer to the glass around the perimeter of the panel. The release layer creates low adhesion between glass and polymer, so that after a circuit assembly has been built on top, it can be readily peeled off.

Alternate layers of metal interconnect and dielectric such as a photo-definable polymer are built up on the base layer. Two-level contacts are formed between adjacent metal layers, and stacked contacts are provided between groups of adjacent layers. Preferably each input/output (I/O) pad of an assembled IC chip is a tested node of the multilayer interconnection circuit. At the center of each I/O pad a stacked contact is preferably created, with stubs at every metal layer, for convenient routing of traces. The base polymer layer, the dielectric layers and the metal layers are flexible, and when the multi-layer interconnection circuit is subsequently removed from the glass panel, it too is flexible. Attached IC chips are usually not flexible (unless thinned down by lapping), but if a folding line on the interconnection circuit is kept clear of IC chips, then the circuit assembly can be folded at the folding line.

While the multi-layer interconnection circuit is still attached to the glass carrier and before it is divided (singulated) into individual circuits, it may be convenient to form a special flip chip assembly layer that includes wells filled with solder at each I/O pad. Each well is designed to accept a stud bump of an attached component. Preferably, gold stud bumps are formed at I/O pads of all IC chips to be assembled. One method of creating the wells employs a thick layer of polymer that is applied on top of the interconnection circuit. Openings in this layer (wells) are formed at each I/O pad (bonding site). The cured polymer layer forms a mask with openings. A squeegee is used to wipe solder paste over the mask to fill the openings, thus forming a well filled with solder at each of the I/O pads. An alternative method for creating the wells is to take advantage of the surface depressions that are associated with stacked contacts, to provide a stacked contact at each I/O pad, and to fill the wells so formed with solder paste using a squeegee.

The glass carrier may be diced with a diamond saw to separate individual circuit assemblies from one another, providing a more convenient form for component assembly, cable assembly, test, and rework. The interconnection circuit must itself be tested, before any assembly is done. This test is preferably performed using a test fixture that connects through a module access port to an external tester. The module access port may include I/O pads (module access pads) for every node of the multi-layer interconnection circuit. The assembly and rework steps require that IC chips and other surface mounted components are precisely located in order that the flip chip placement tool can accurately align bonding sites on the components with corresponding bonding sites on the interconnection circuit. Accordingly, the circuit assembly remains attached to the glass carrier, and its dimensional accuracy is maintained until these steps are completed.

A module cable with high-density interconnections is preferably attached to each circuit assembly while the attached carrier provides dimensional stability. Each circuit assembly is then separated from its glass carrier by peeling the base substrate away from the carrier. A low adhesion force is provided in these regions so that separation can be accomplished without damaging the interconnection circuits or the attached components.

The methods for fabricating interconnections and bumps and wells can be applied to cables as well as to circuit boards, as will be described.

Module level coatings including dielectric and conductive layers are applied to the tested circuit assembly to create a circuit module that is hermetically sealed and electro-magnetically shielded. To effectively cool the dense circuit module, it may be bonded to a heat sink, and the heat sink may be cooled with a circulating fluid.

It should be understood that for diagrammatic purposes some parts of the figures are drawn to scale and some are not. For example, the vertical dimension of a layer that is not the focus of a particular drawing may be contracted. In other figures the thickness of very thin layers is expanded in order for them to show in the figure.

DESCRIPTION OF THE PREFERRED EMBODIMENTS

Figure 1A:
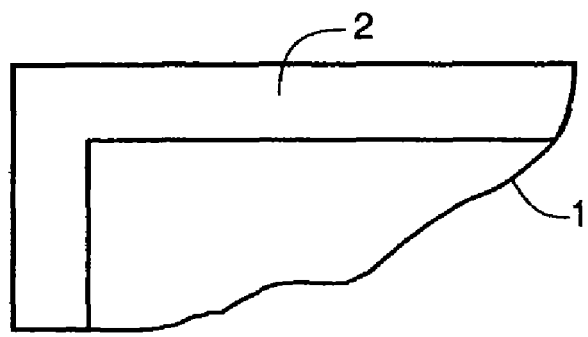
FIG. 1A-1C shows a corner fragment of a glass carrier in plan view, describing the process steps for creating a polymer base layer on a release layer.
Figure 1B:
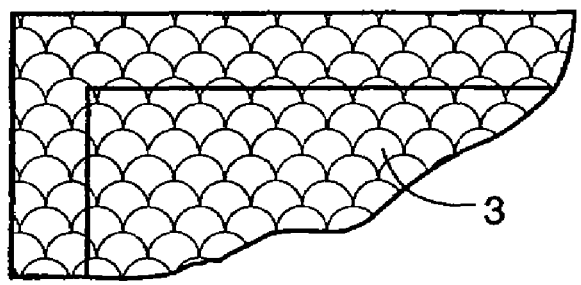
Figure 1C:
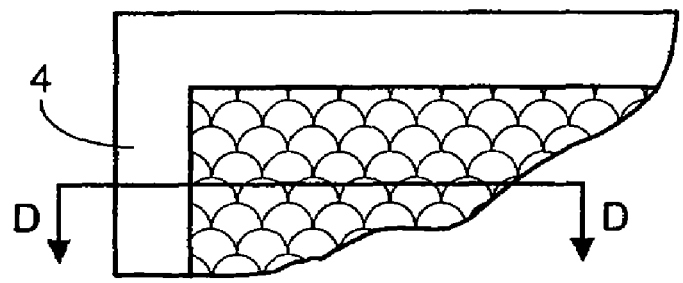
Figure 1D:
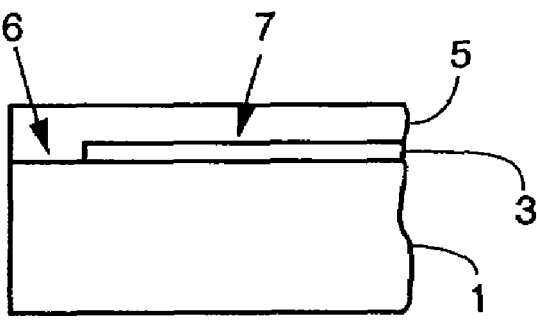
FIG. 1D is a cross-sectional view of section DD of FIG. 1C, and shows the base polymer layer in relation to the release layer.

FIG. 1A shows a corner fragment of a glass carrier 1. Photo resist has been patterned on the carrier, so that a border of resist, 2, having a width of approximately 20 mm, surrounds the perimeter. FIG. 1B shows that a film of release layer, 3, has been applied over the entire surface of the glass carrier. A suitable material for the release layer is a fluorinated silicone such as F065 manufactured by Gelest, Inc., in Morrisville Pa., USA. This material is a single part gel. It can be applied as a fog or fine spray, or using the spin-on method. A suitable thickness is 2-5 microns after curing, with 2 microns preferred. A typical curing cycle is 125° C. for 25 minutes. This release material has a silane component that bonds well to glass surfaces, yet presents a fluid-like interface to polymeric materials like the base layer to be subsequently applied. FIG. 1C shows the result of lifting the resist to pattern the release layer, using a developer or resist stripper to swell the resist; border 4 is clear of release material. A base layer 5 is then applied. Base layer 5 is preferably a polymer, and is applied in liquid form with a metering roll, an extrusion coater, or using a spin-on or spraying method. A suitable polymer is Cyclotene, a polyimide manufactured by Dow Chemical, also known as BCB (benzocyclobutene). No adhesion promoters are used. After curing, a suitable thickness of base layer 5 is 40-80 microns, with 50 microns preferred. FIG. 1D is a cross-sectional view of section DD of FIG. 1C, and shows the relation between glass carrier 1, release layer 3, and base layer, 5. Surface region 6 is characterized by high adhesion between the base layer and the carrier, and surface region 7 is characterized by low adhesion between the base layer and the release layer. Base layer 5 may later be peeled off of surface region 7 without damage to the base layer or to circuits built thereon. An alternative method for providing the base layer to serve as the substrate for the interconnection circuits is to laminate a preformed sheet of polymeric material onto the glass carrier, providing a combination of adhesives to effect strong adhesion in surface region 6 for anchoring the edges of the sheet, and weak adhesion in surface region 7 for facilitating later release.

Figure 2:
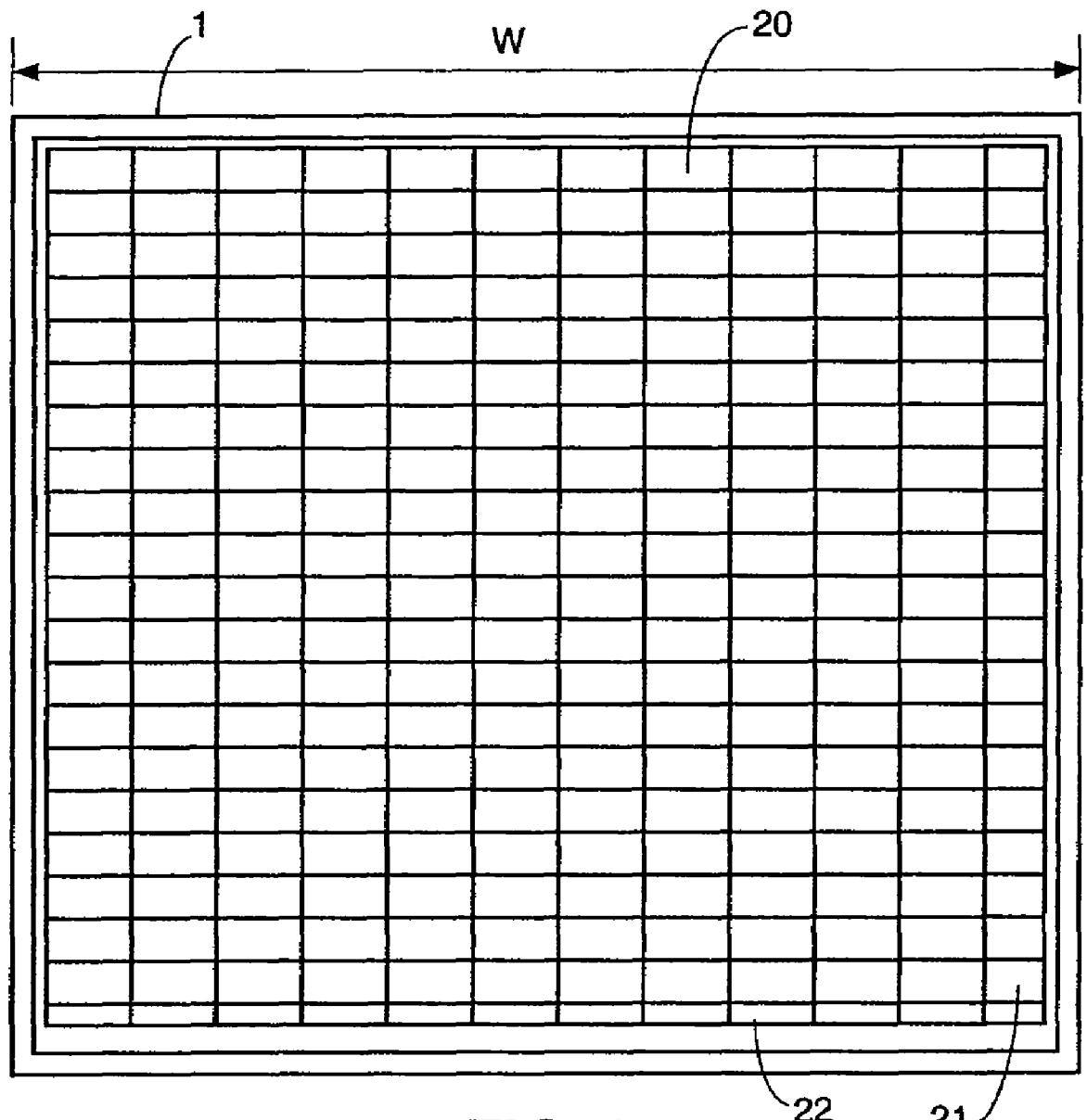
FIG. 2 is a plan view layout of multi-layer interconnection circuits arrayed on a glass carrier.

FIG. 2 shows a glass carrier 1 with a width, W, of 1250 mm, typical of $5^{th}$ generation LCD panels. A recent facility has been announced that will handle substrates 1870 mm×2200 mm. Although any size glass carrier can be used to carry out the present invention, larger sizes result in lower costs for the associated interconnection circuits, including special flip chip assembly layers that may be required. Materials other than glass can be used for the carrier, providing they are rigid and dimensionally stable. Glass is preferred in the current invention because it is well characterized as a substrate material, and it is used with mature panel manufacturing methods such as for LCD fabrication. Individual multi-layer interconnection circuits 20 are arrayed across the glass carrier. In this example, interconnection circuits 20 measure 4 inches by 2 inches, and 220 copies are arrayed on the carrier. Multi-layer interconnection circuits 21 and 22 have different sizes representing other circuits to be manufactured. Border region 23 corresponds to surface region 6 of FIG. 1, and is a region of high adhesion between base layer 5 and glass carrier 1. When glass carrier 1 is diced into interconnection circuits 20, 21, and 22, it can be seen that the resulting circuits include only regions of low adhesion, for easily peeling away the individual glass carriers of interconnection circuits 20, 21, and 22. An alternative version of the layout represented in FIG. 2 includes streets of high adhesion provided between each of the interconnection circuits, included for improved dimensional stability of the individual circuits such as 20, and these streets are removed during the dicing operation.

Figure 3A:
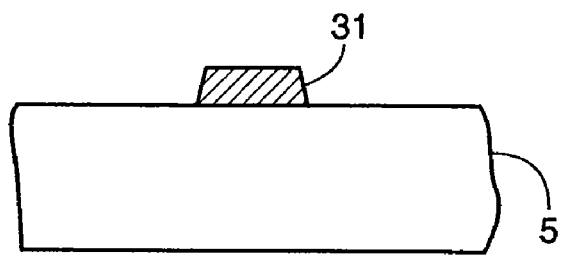
FIG. 3A-3E shows a series of cross-sectional views depicting the process steps for creating the first few layers of an interconnection circuit.
Figure 3B:
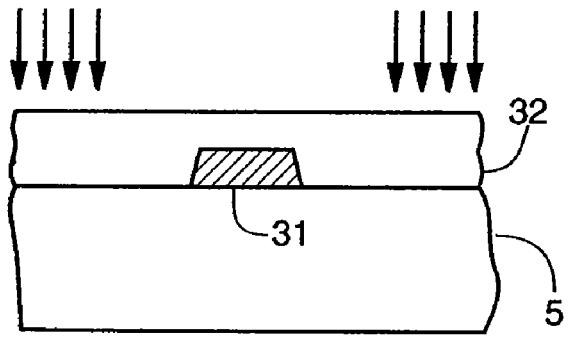
Figure 3C:
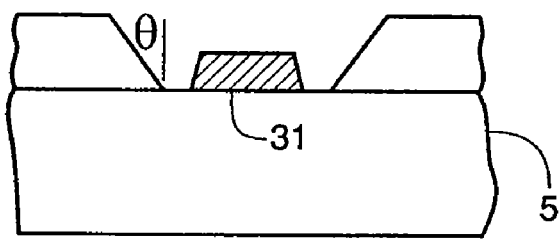
Figure 3D:
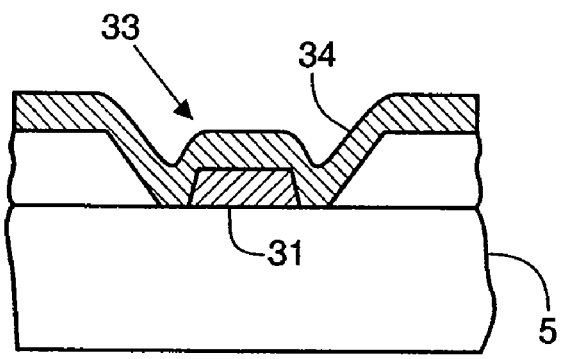
Figure 3E:
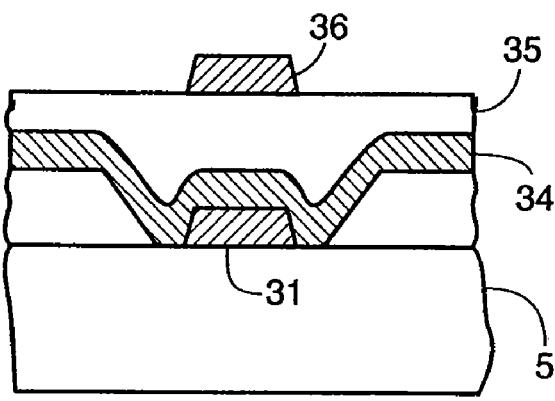

FIG. 3A-FIG. 3E represents the preferred method for forming thin film layers of multi-layer interconnection circuit 20 on base layer 5. The preferred method and materials contained herein are better suited to low power electronic modules such as cell phones than high performance circuits that may require copper conductors at greater trace thickness. The aluminum conductors may be arranged as transmission lines for high frequency operation, requiring controlled horizontal spacing between traces as well as controlled vertical spacing between traces and reference planes (not shown), as is known in the art. The metal layers of multi-layer circuit 20 are preferably aluminum, deposited by sputtering in a vacuum chamber. A suitable thickness range is 1-2 microns, with 1 micron preferred. The metal layers are masked using conventional photolithographic methods known in the art, and are preferably dry etched using plasma etching processes, also known in the art. The patterning of each layer typically includes coating with photo resist, exposing with light through a mask or reticule, developing the resist to form openings where the material is to be removed, and etching of the layer through the openings in the resist. Alternative metals may be used. In FIG. 3A a patterned trace of metal 31 is shown on base layer 5. For example, this trace has a width of 5 microns and a thickness of 1 micron. In between each layer of patterned metal is a layer of patterned dielectric, to provide isolation in the vertical direction between the metal traces. In FIG. 3B, the substrate and metal traces have been coated with a planarizing layer 32 of a photo-definable polymer as the inter-layer dielectric. A suitable photo-definable polymer is photo BCB, benzocyclobutene, a photosensitive form of Cyclotene. The term "photo-polymer" shall be used hereinafter for this material. The photo-polymer is applied in liquid form to planarize the surface. A suitable thickness of photo-polymer layer 32 is 2-4 microns after curing, with 2 microns preferred. In FIG. 3B a masked region of photo-polymer is exposed to light where the material is to remain. The effect of light on the photo-polymer is to form cross-linked molecules that become solidified (polymerized) and are not dissolved in the subsequent development step. Polymer material that is not exposed to light does not develop cross-links and is removed by the development step. This is the same mechanism that occurs when patterning a negative photo-resist, and is referred to as negative image development. FIG. 3C shows the result of developing the polymer. The masked illumination of the exposure process causes photons to penetrate the surface of the polymer. The photons spread laterally as they penetrate to lower depths, causing cross-linking as they spread. The net result is a patterned polymer layer having tapered contact windows with an angle, θ, of approximately 45°, as shown in FIG. 3C. Typically, contact windows have a curved profile that is approximated by the straight line shown. FIG. 3D shows the result of depositing and patterning the next layer of metal, 34, to form the two-layer contact, 33 between traces 31 and 34. Because the contact window is tapered rather than vertical, and because sputtering from a large area target provides multiple deposition angles, good metal coverage is achieved at the contact walls. FIG. 3E shows the addition of the next photopolymer layer 35, and patterning of the next metal layer as metal trace 36. The foregoing description teaches the formation of multi-layer interconnection circuits, with alternating patterned metal and patterned polymer layers, by repeating the foregoing steps.

Figure 4:
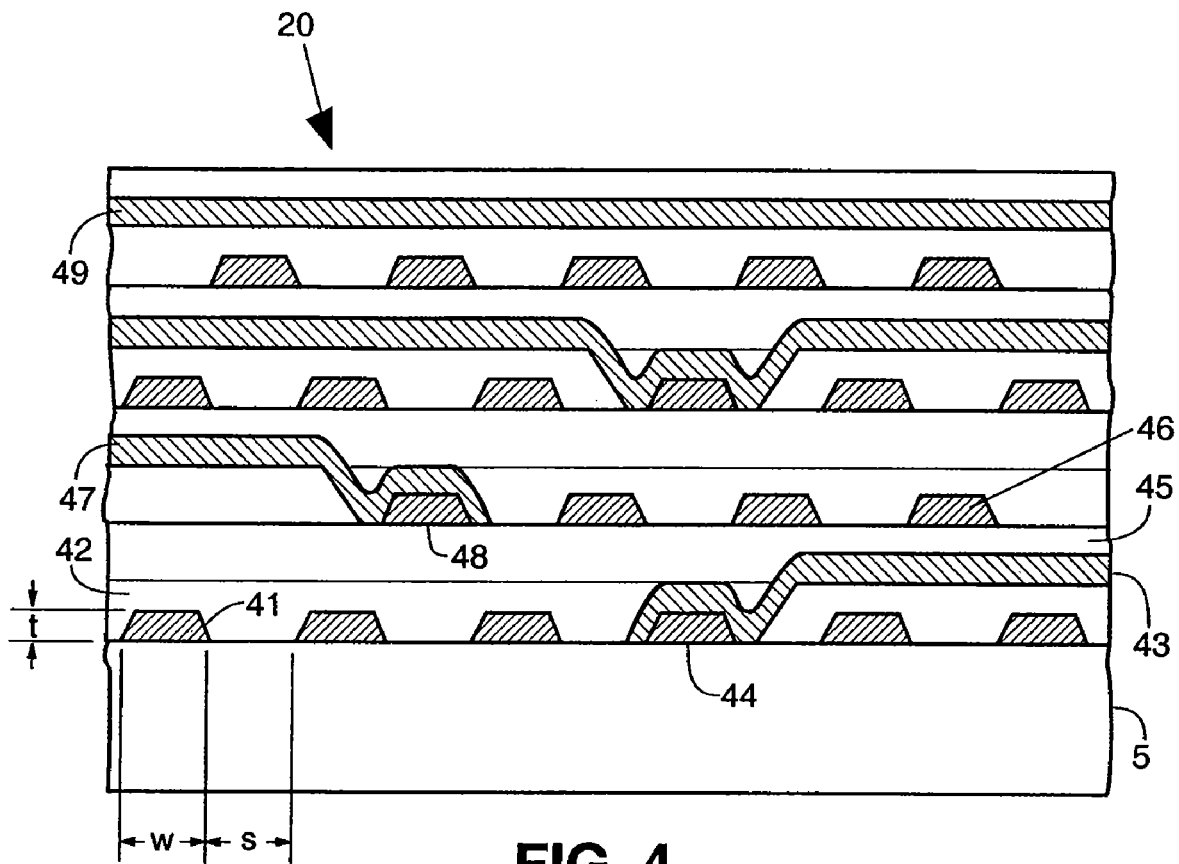
FIG. 4 is a cross-sectional view of a multi-layer interconnection circuit of the current invention.

FIG. 4 is a cross-sectional view of an example multi-layer interconnection circuit 20 of the present invention, introduced in FIG. 2. Base polymer layer 5 is shown. Conductive trace 41 of first layer metal is shown, with width, w, of 5 microns or less, spacing, s, of 5 microns or less, and thickness, t, of approximately one micron in the preferred embodiment. It may be desirable to arrange conductors on alternate layers to be generally orthogonal as in the figure, as is common practice for layout efficiency. A planarizing layer of photopolymer, 42, has been applied over the first layer metal pattern with a preferred thickness of two microns after curing. A trace of second layer metal, 43, forms a two-level contact with a trace 44 of first layer metal. The next photo-polymer layer 45 again has a preferred thickness of 2 microns, and covers second layer metal 43 with a thickness of 1 micron. Photopolymer layer 45 provides a planar surface for deposition and patterning of a third layer metal such as trace 46. Trace 47 is fourth layer metal and connects using a two-level contact to a trace 48 of third layer metal as shown. Additional layers are built up in the same manner, as required, and in principle any number of metal layers can be provided. In the figure, trace 49 is on the eighth metal layer.

Figure 5A:
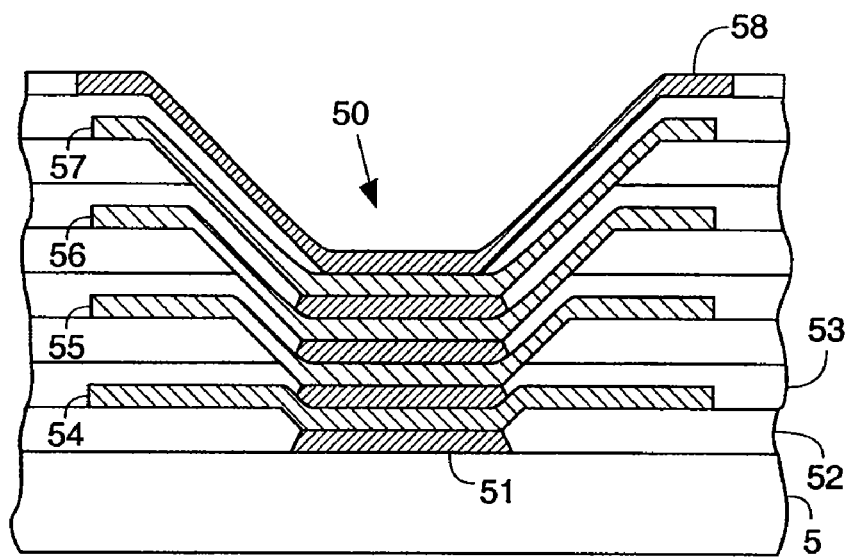
FIG. 5A is a cross-sectional view of a stacked contact.

FIG. 5A shows an expanded cross-sectional view of a stacked contact 50 at an input/output (I/O) pad. Metal traces on alternate layers are preferably orthogonal as shown. A trace 51 of first layer metal is shown with a suitable trace width of 8-12 microns in this contact structure, with 10 microns preferred. Planarizing layers of photo-polymer such as 52 and 53 are used between each metal layer, as described in reference to FIG. 3 and FIG. 4. Trace 54 of second layer metal contacts trace 51 as shown. A contact stack of all metal layers is built up layer by layer, with stubs provided for connecting metal traces at any level. Stubs are short metal traces that are provided to establish points of access at each metal layer. Most of them will never connect to anything else. However, some of them will be extended into circuit traces of the interconnection circuit. Trace stubs 54, 55, 56, and 57, are on metal layers 2, 4, 6, and 8, respectively. Similarly, at 90 degrees rotation from these stubs, the odd numbered metal layers also have similar stubs (not shown). Finally I/O pad 58 connects with the contact stack as shown. It may be convenient to build a stacked contact like 50 at all of the I/O pads. The width of I/O pad metal is approximately 85 microns in the preferred embodiment, providing ample space for such a stacked contact. It is convenient for the circuit board layout designer to know that every node in the circuit is available at all metal layers (using the stubs), and at a known location.

Figure 5B:
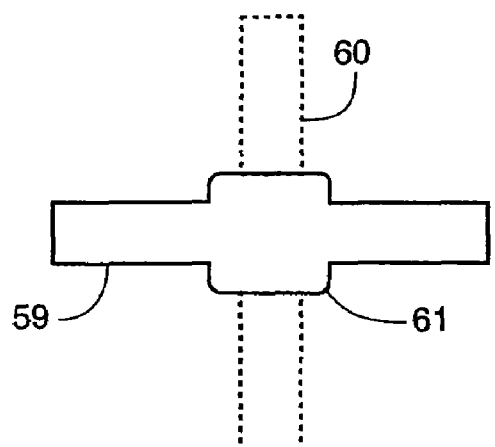
FIG. 5B is a plan view of a stacked contact, excluding I/O pad metal.

FIG. 5B shows a reduced plan view of the stacked contact of FIG. 5A, excluding I/O pad 58 to reveal the locations of the stubs. The location of stubs on even-numbered metal layers is shown 59, and odd-numbered metal layers 60. The common area 61 of the stacked contact is also shown.

Figure 6:
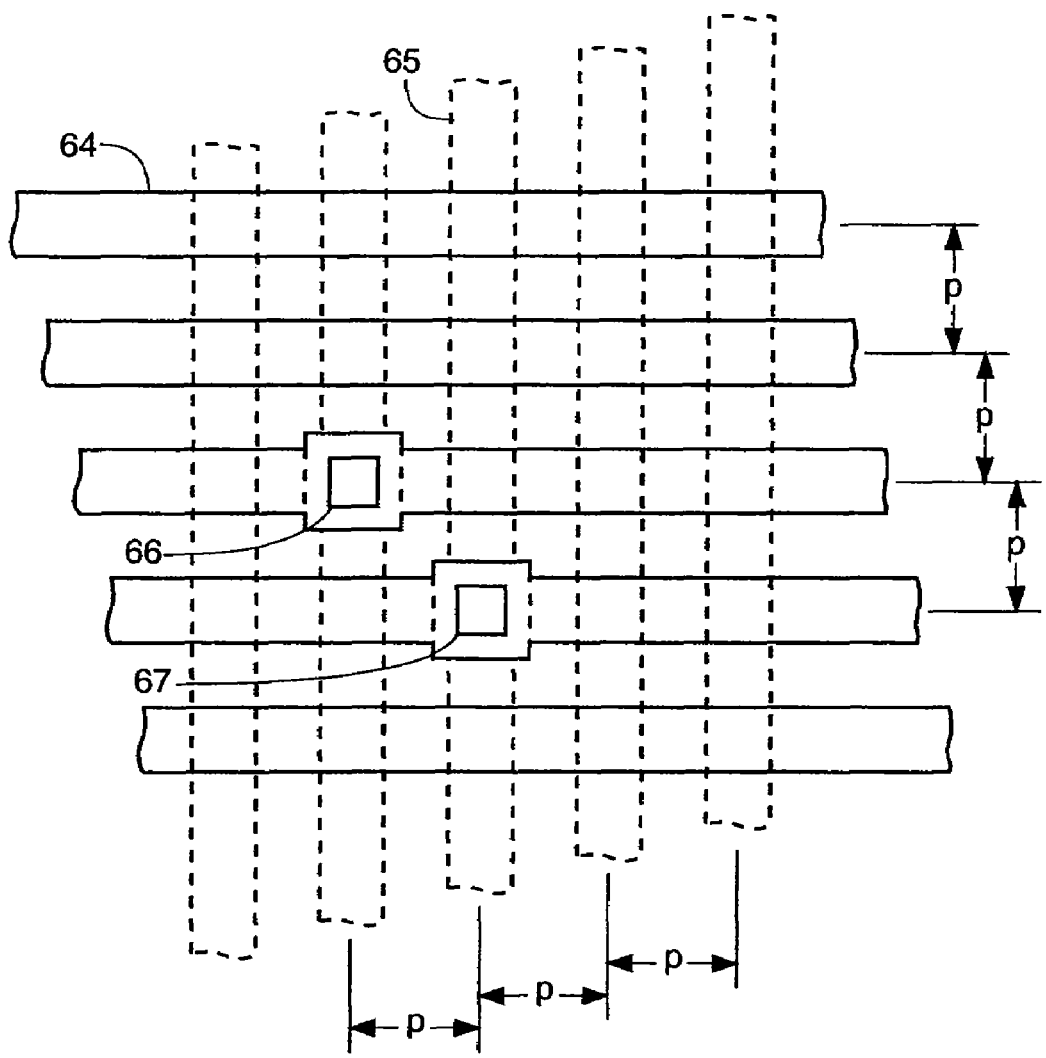
FIG. 6 is a plan view of an array of orthogonal metal traces with trace pitch, p.

Stacked contact 50 is necessarily larger in horizontal area than two-level contact 33, because of the long sloping contact walls. The trace pitch for parallel runs of metal is a critical parameter for densely packed interconnection circuits. Parallel runs of metal generally require contacts to traces on other layers for effective trace routing of a multi-layer interconnection circuit. To achieve minimum trace pitch for such parallel runs, it is desirable to use contacts of minimum size. This can be accomplished if contacts that are formed at locations other than at the I/O pads are limited to two-level contacts. This is shown in FIG. 6. Horizontal traces such as 64 are on an even-numbered metal layer. Vertical traces such as 65 are on an adjacent odd-numbered metal layer. Contact windows 66 and 67 are for two-level contacts; they are closely spaced but staggered, and have a minimum contact area. The trace pitch p is consistent at 10 microns or less in both directions, and not increased for traces with contacts. This enables dense wiring patterns with predictable space requirements for trace routing programs. The close trace spacing in FIG. 6 is suitable for low speed signals. Higher speed signals may require wider spacing to avoid cross-talk issues.

Figure 7:
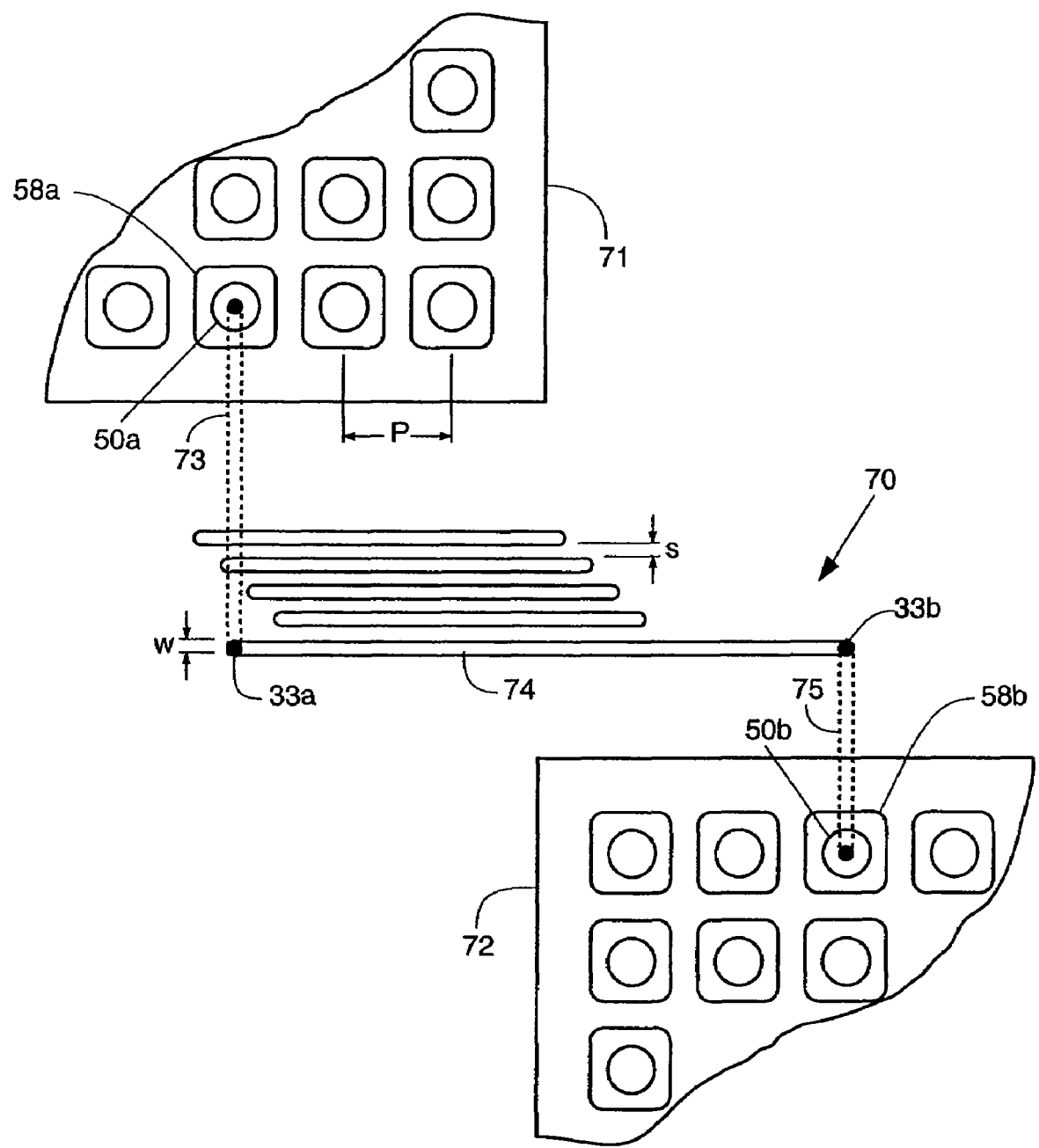
FIG. 7 is a schematic plan view of a circuit node connecting between I/O pads on separate IC chips.

FIG. 7 is a schematic plan view of a circuit node 70 that connects between an I/O pad 58a on IC chip 71, and I/O pad 58b on IC chip 72. A stacked contact 50a is shown at I/O pad 58a, as described in reference to FIG. 5. Trace 73 is on a metal layer below the I/O pad layer (surface layer), for example on metal layer 7 in a circuit with 8 metal layers. Trace 73 contacts using two-level contact 33a to trace 74, which is on metal layer 8 in this example. A set of parallel metal traces on layer 8 is shown, each trace having a width, w, of 5 microns or less in the preferred embodiment. The separation, s, between traces is also 5 microns or less in the preferred embodiment. The I/O pad pitch, P, can range from 60-200 microns, and 95 microns is preferred. Circuit node 70 continues from trace 74 to contact 33b, contacting to trace 75 on metal layer 7 in the example, and terminates at I/O pad 58b using stacked contact 50b.

Having explained the details of building a high density interconnect structure in the form of a flexible multi-layer interconnection circuit, we shall now focus on assembly and testing of IC chips on the interconnection circuit, to form a circuit assembly.

Figure 8A:
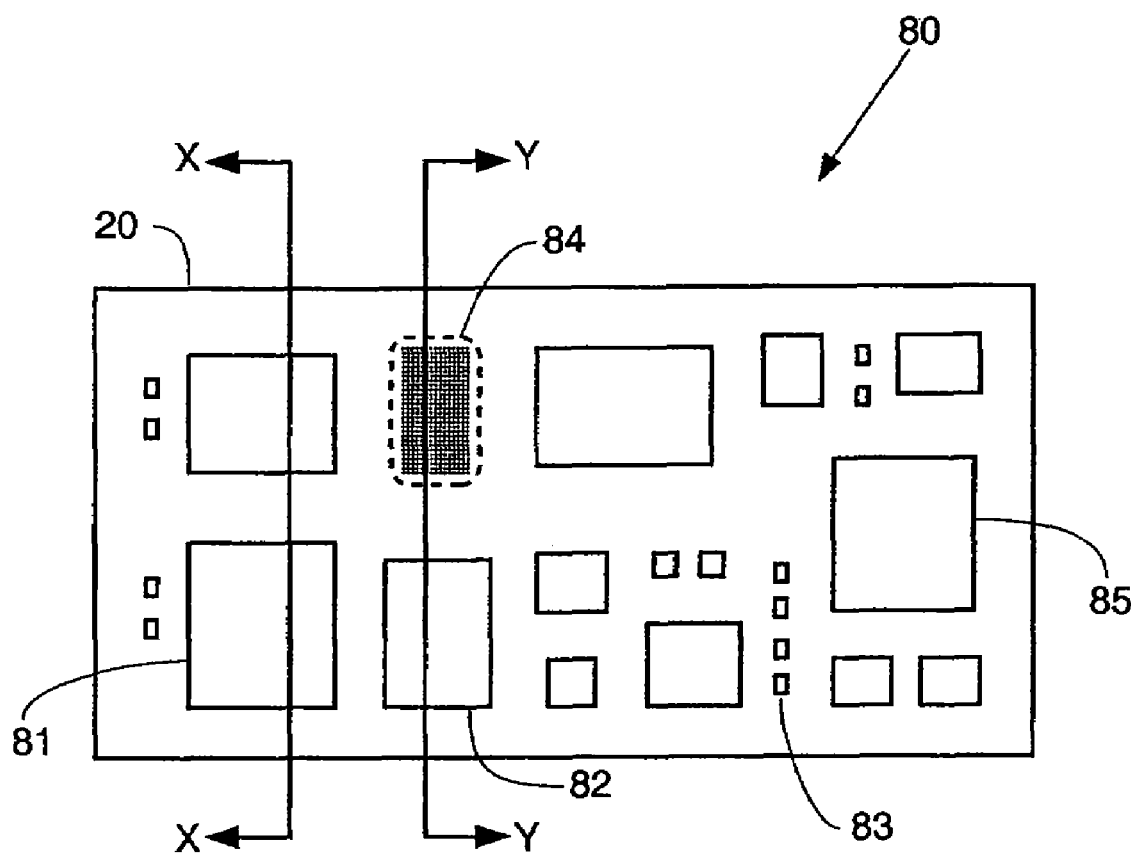
FIG. 8A is a plan view of a circuit assembly of the current invention.

FIG. 8A shows circuit assembly 80 with multiple IC chips such as 81 and 82, and other surface-mounted components such as 84 on multi-layer interconnection circuit 20. Components 81-83 are preferably attached by the flip chip assembly method, including stud bumps and wells filled with solder as described herein. Alternatively, surface-mount components may be attached using known solder re-flow techniques. Module access port 84 provides an array of module access pads (I/O pads) for connection to external signals and power, as well as for connection to internal nodes of the interconnection circuit for testing purposes, as will be further described. IC chip 85 is a special-purpose test chip in the preferred embodiment. For testing different circuit types, such as digital, analog, and radio frequency (RF), it may be desirable to assemble more than one special-purpose test chip. Alternatively, all forms of testing may be accomplished using external testers, accessed through module access port 84.

Figure 8B:
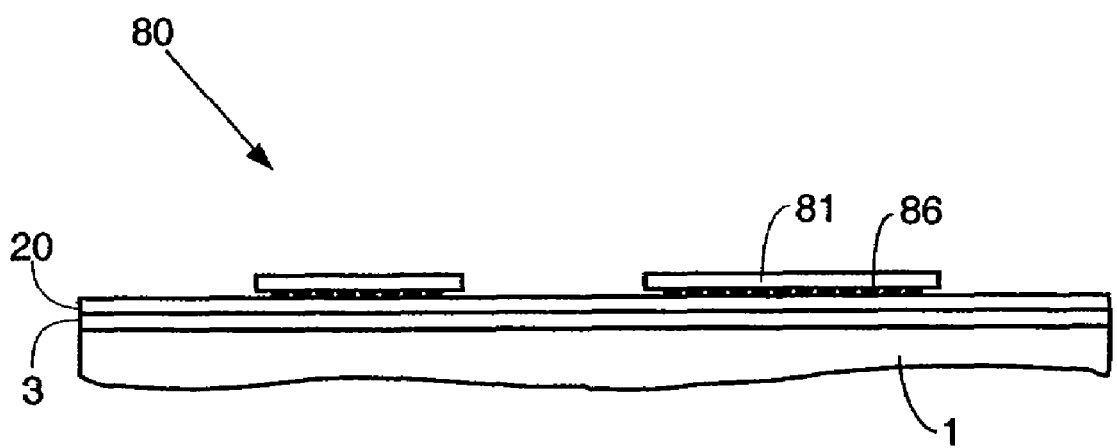
FIG. 8B is a cross-sectional view of section XX of FIG. 8A, and represents a circuit module in process.

FIG. 8B represents a cross-sectional view of section XX of FIG. 8A. Circuit assembly 80 is supported on release layer 3 on top of glass carrier 1. It includes interconnection circuit 20 plus attached components. IC chip 81 is attached using flip chip connections such as 86, which will be further described with reference to FIG. 9.

Figure 9A:
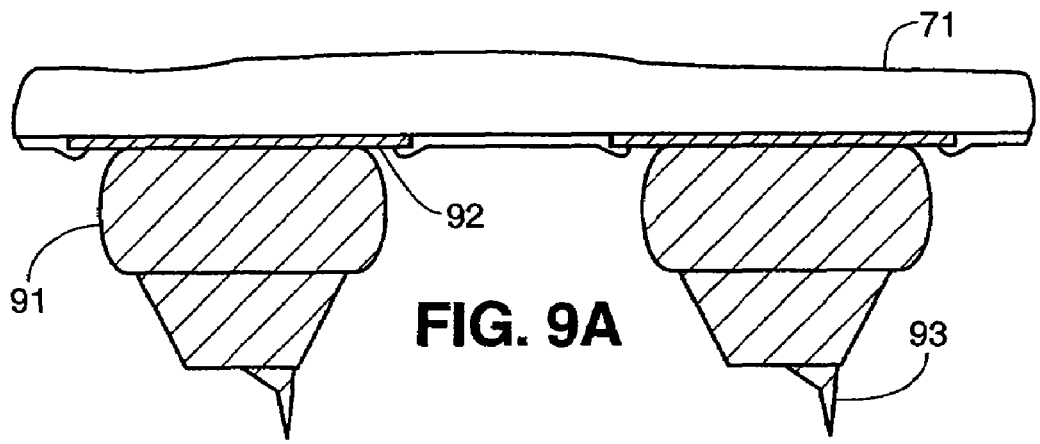
FIG. 9A-9C shows structural cross-sections depicting a first method of flip chip assembly.
Figure 9B:
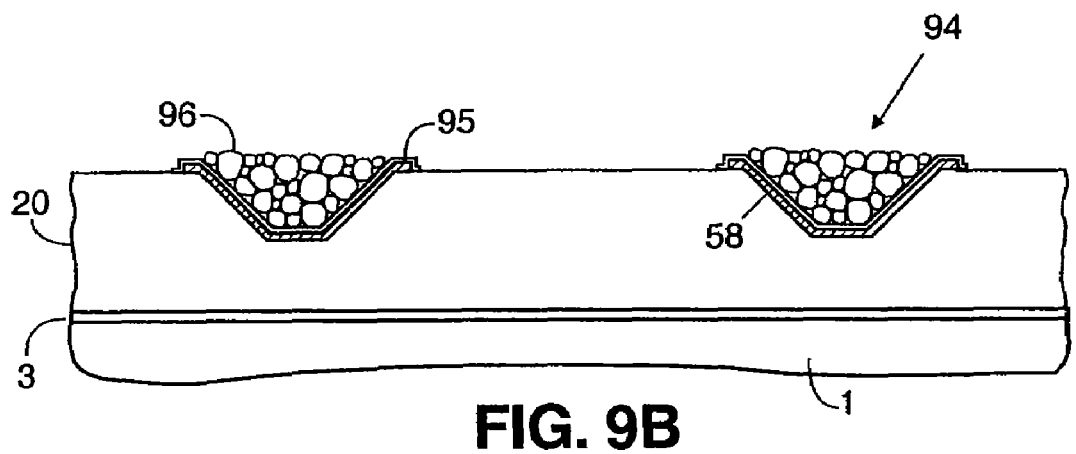
Figure 9C:
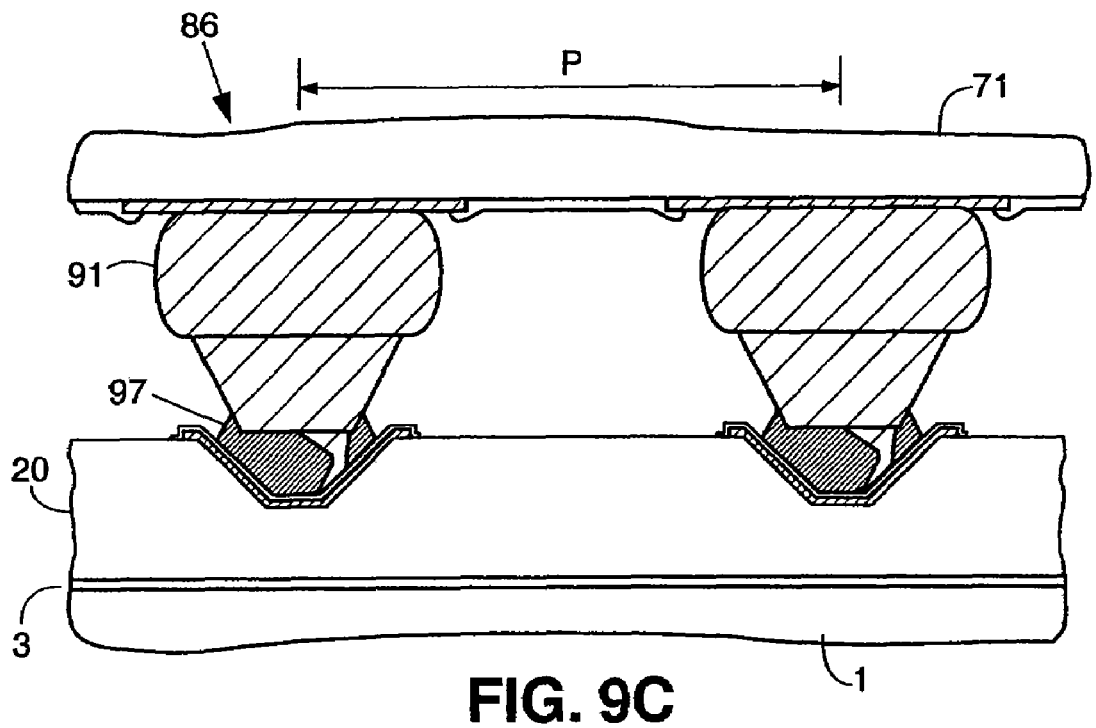

FIG. 9A-9C shows a sequence of steps describing a first method of the current invention for creating a flip chip bond (direct chip attachment). FIG. 9A shows that an IC chip 71 has been prepared for assembly by forming gold stud bumps such as 91 at I/O bonding pads such as 92. Stud bumps 91 can be created using a Kulicke and Soffa 8098 bonder, using the application of heat, pressure, and ultrasonic energy, as is known in the art. The process for forming the ball portion of the stud bump is the same as for a ball bonder (conventional wire bonder). If an 18-micron diameter gold wire is used, the bonder can be configured to make stud bumps such as 91 with a ball diameter of 50 microns and an overall height of 50 microns. The "beard" 93 is created by accurately shearing the gold wire, and according to Kulicke and Soffa, the tips of the beards can be coplanar within ±2.5 microns across a 200 mm field. FIG. 9B shows I/O pads 58 as shaped for stacked contacts, as previously described in reference to FIG. 5A. Interconnection circuit 20 is attached to glass carrier 1 via release layer 3, and glass carrier 1 is providing the necessary dimensional stability during assembly. The depression at a stacked contact may be used as a well for assembly purposes. A metallization 95 is patterned over each I/O pad 58 as shown, to prevent diffusion of solder materials or dissolved gold into multi-layer circuit 20, to provide an oxidation barrier, and also to provide a solder-wetting surface. An acceptable sequence of layers for metallization 95 is an adhesion layer of aluminum, a solder diffusion layer of nickel, and an oxide prevention layer plus solder wettable layer of copper. This sequence is known in the art as under bump metallization, UBM. Multi-layer interconnection circuit 20 is further prepared for IC chip assembly by filling the wells with solder paste, thus creating a well filled with solder 94 at each I/O bonding pad 58. Solder paste 96 is applied using the wiping action of a squeegee over the exposed surface. In the preferred embodiment, using a large glass panel as the carrier, several million wells are typically created with one pass of the squeegee. Solder paste 96 is laterally confined by the wells. FIG. 9C shows a completed flip chip bond 86 of the current invention, with stud bump 91 inserted into well 94. Since the height variation of the stud bumps is held to approximately ±2.5 microns, and since the beard is a ridge of small cross-section, and since gold is a soft and malleable material, a small amount of pressure applied to an IC chip will result in the tips of the beards conforming to and making uniform contact with the bottoms of the wells. The depth of well 94 and the softness of the solder paste provide a vertical compliance during flip chip assembly, thus avoiding broken chips. In FIG. 9C solder paste 96 has been melted and cooled to form solder 97, thus creating a permanent electrical and mechanical bond. Solder 97 forms a strong mechanical bond with the beard and the underside of the stud bump, as well as a low resistance contact. Since the stacked contacts are patterned photo lithographically they are accurately placed within a few microns and their size and shape are repeatable, leading to high yield assemblies. The pitch, P, is 95 microns in FIG. 9C, and is preferably in the range of 60-200 microns. Solder paste 96 is preferably an indium-based material such as Indalloy 290 comprising 97% In and 3% Ag, with a melting point of 143° C. This material is designed to solder gold electrodes with minimal dissolution of the gold, and without forming undesirable inter-metallic compounds that could impair the mechanical integrity of flip chip bond 86 or degrade the ability to perform rework. It also solidifies in a semi-rigid form, providing some additional mechanical compliance compared with Pb:Sn solders. Additionally, it does not contain Pb which is an environmental contaminant. The melting point of 143° C. is lower than that of all common production solders. This is good for rework: less heating is required to melt the solder and a smaller overall temperature excursion results in less thermal stress during each rework cycle.

The sequence of FIG. 9A-9C represents a cost-effective method of creating the wells filled with solder 94, because the well shapes are already provided by the stacked contacts at each I/O pad. Thus a separate process is not required to fabricate the wells. However, some manufacturers may prefer not to use stacked contacts, and some interconnection circuits may not include enough layers to create sufficiently deep wells. For these cases a second method is proposed for fabricating the wells, as shown in FIG. 1A-10D.

Figure 10A:
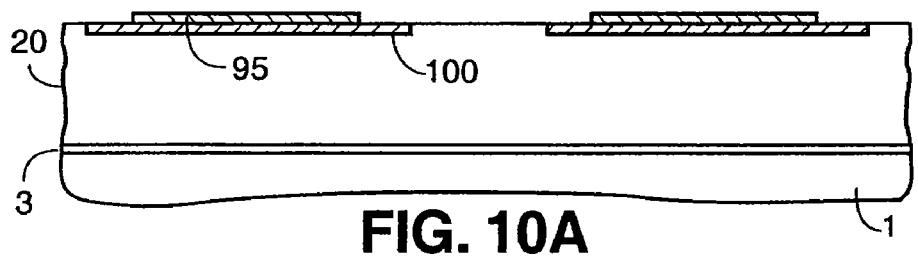
FIG. 10A-10D shows structural cross-sections depicting a second method of flip chip assembly employing a special assembly layer.
Figure 10B:
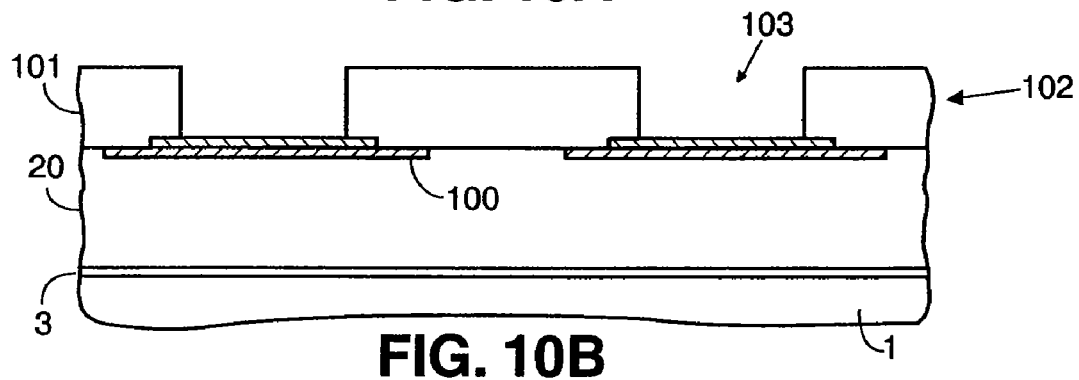
Figure 10C:
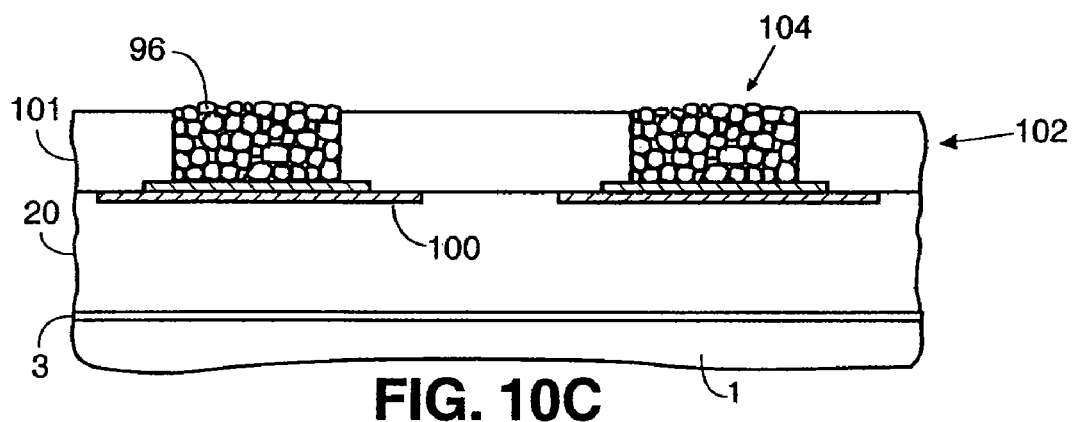
Figure 10D:
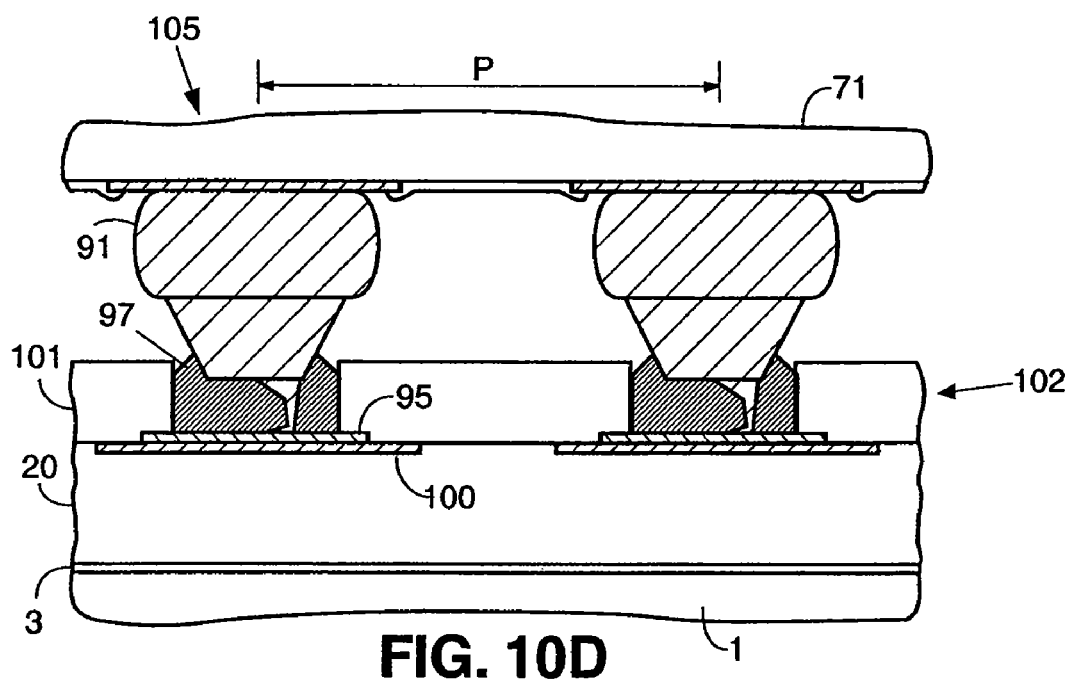

In FIG. 10A interconnection circuit 20 is shown, including flat I/O pads 100, coated with metallization 95 as previously described. Again, glass carrier 1 is present for dimensional stability. In FIG. 10B a planarizing layer 101 of non-photo-definable polymer such as BCB is formed on top of interconnection circuit 20, at a thickness of approximately 15 microns when cured. Polymer layer 101 is masked and etched using known dry etching techniques to create openings (wells) 102 above the pads. The diameter of the wells is approximately 34 microns in the preferred embodiment. The openings preferably have vertical walls as shown, providing maximum resistance to shear forces in the final assembly (with chips attached). Vertical walls are not generally producible using photo-defined polymers such as photo BCB, and this is why dry etching is used, preferably with an anisotropic etching characteristic as is known in the art. Polymer layer 101 forms the solder paste mask and is typically not removed, i.e., it remains a part of the finished circuit assembly. This special assembly layer is numbered 102. Solder paste 96 is wiped over the exposed surface using a squeegee and is laterally confined by openings 103. By this means, a second preferred embodiment of wells filled with solder 104 is created as shown in FIG. 10C, and a second embodiment of bonded connection 105 including a gold stud bump 91 mated with a well filled with solder, as shown in FIG. 10D. A strong mechanical bond is formed between gold stud bump 91 and I/O pad 100 because solder 97 adheres strongly to stud bump 91 and to metallization 95 (which in turn is strongly bonded to I/O pad 100), and solder 97 is well contained and structurally supported by openings 103. There are no fragile leads exposed to the assembly process, because fragile signal traces (not shown) are terminated in I/O pads 100 such that the traces are a short distance away from flip chip attachment 105; this means that a direct attached component can be reworked (replaced) without danger of damaging the signal traces. I/O pad pitch, P, is shown at 95 microns, enabled by the photolithographic precision employed for patterning the various layers, plus the small lateral dimension of gold stud bumps (approximately 50 microns for the stud bumps shown), and the dimensional stability of the underlying carrier. A range of I/O pad pitch from 60-200 microns is preferred.

It is a primary goal of the current invention to provide flip chip assemblies that can be reworked when a defective chip needs replacement. The process should be simple and effective, and robust enough to perform as many times as may be necessary. Consequently, it is important to choose a solder composition that does not significantly dissolve the stud bump material, does not form brittle intermetallic compounds, and for which the melting point is not significantly increased during assembly or rework cycles. Gold is the preferred material for the stud bumps. As previously described, an example of a solder material that is compatible with gold stud bumps and the flip chip bonding methods proposed herein is indium-based solder Indalloy #290, obtainable from Indium Corporation of America, Utica, N.Y. The amount of paste in a well is approximately $1.5 \times 10^{-8}$ gm in the second preferred embodiment, at a material cost of approximately US$3.48 per gram. For either method of fabricating the wells, the cost of filling the wells is low when large glass carriers are used because typically several million wells are filled in parallel. Preferably, a squeegee is used to wipe solder paste over the mask (or over the I/O pad indentations provided at stacked contacts in the first embodiment) to deposit the paste in the wells. The cost per stud bump using a Kulicke and Soffa 8098 bonder is approximately 0.03 cents, based on data provided by Kulicke and Soffa for 200,000 bumps on an 8-inch wafer. Consequently, the cost of each flip chip connection in the current invention, including the stud bump and the corresponding well, is estimated at less than 0.05 cents or US$0.0005. This compares with current costs per connection of approximately 0.3 cents for wire bonds in a comparably similar circuit assembly, and typically higher costs for other flip chip attachment methods. Such a low cost for the current invention may mean that additional test points can be included within a satisfactory overall test cost.

The rework process for replacing a defective IC chip on a circuit assembly of the current invention is as follows. Heat is applied using a hotplate under glass carrier 1, typically bringing the carrier to a temperature below the solder melting point. For the preferred solder, Indalloy 290, this temperature may be approximately 118° C. Hot inert gas is applied to the backside of the chip; the gas is directed and confined so as to melt the solder of a single component, avoiding neighboring components. When the solder melts at around 143° C., the defective component is removed by withdrawing the stud bumps from the wells. The surface around the affected wells is inspected. Touchup may include cleaning of the surface area around the wells and addition of more solder paste into the wells; the board is then ready for a replacement component.

The bump/well connection method described in FIG. 9 and FIG. 10 can be applied to fabricating a connection between any pair of electronic components. It only requires that bumps be formed on one part (the male part) and corresponding wells be formed on the other part (the female part). Accordingly, IC chips and other components may be provided with either wells or bumps, as long as the matching structure is fabricated on the mating part.

Figure 11A:
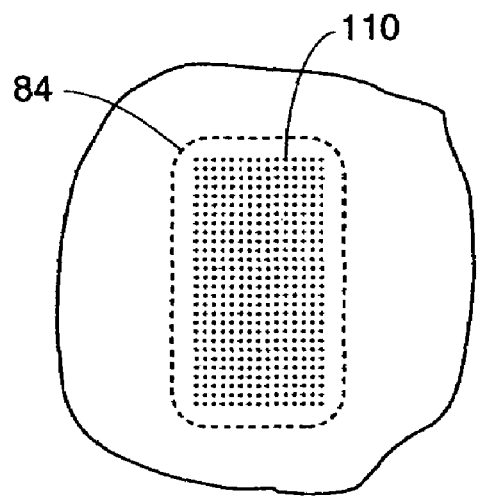
FIG. 11A is a plan view of a fragment of an interconnection circuit after additional processing to create the module access port.

FIG. 11A represents an example of a module access port 84 with individual module access pads such as 110 arrayed as shown. The module access pads provide a means for electrical connection from interconnection circuit 20 or from circuit assembly 80 to other electronic assemblies or devices, and include provision for data signals, control signals, and power. As will become apparent, the bump/well bonding structures described for these pads are similar or identical to those described for the pads of IC chips.

An external tester that is connected to assembly 80 through module access port 84 may be used to validate the integrity of the interconnection circuits prior to assembling IC chips and other components. It may be advantageous to provide a module access pad for every node on the interconnection circuit, to provide 100% test coverage. If a module cable of the current invention is used, as further described with reference to FIG. 15 through FIG. 19, module access pads 110 can have a pitch of less than 100 microns, just like flip chip bonds 86 and 105. If an interconnection circuit has 50,000 nodes corresponding to a medium-complexity system board, then the area occupied by the module access port is only 5 square centimeters at a bonding pitch of 100 microns (2.24 cm on a side). Testing for short circuits is typically provided between all of the nodes, and testing for open circuits may also be performed on critical nets (distributed nodes). This is similar in concept to a "bed-of-nails" test that is typically performed on conventional printed circuit boards. In some cases, repair of defective interconnection circuits may be appropriate, perhaps using focused ion beams, FIB, for cutting traces, or other types of beams for building new ones.

It may be advantageous to apply the bump/well assembly method to the problem of aligning a pair of components. In this case, stud bumps are provided on a face of one of the components, and a matching set of wells is provided on a face of the other component. A two-step alignment procedure is preferred for precise alignment. In the first step, alignment within a few microns is achieved by the inherent precision of locating the stud bumps in the wells. In the second step, the alignment may be fine-tuned to within a fraction of a micron displacement error and small angular errors by monitoring an alignment-sensitive parameter of the combined pair, and optimizing the alignment using this parameter while the solder is molten. This procedure could be used to align optical assemblies for example, and signal to noise ratio of a light beam traversing the combined assembly may be a suitable parameter to monitor while optimizing the alignment. The bumps and wells could be located sufficiently far from the light path so as not to interfere. It may also be desirable to form the wells in a hard material, for greater rigidity and precision.

A circuit assembly such as 80 will typically require several different working voltages for operation. Preferably, power at the highest working voltage will be delivered through module access port 84 (preferably using multiple pins, in a distributed fashion), and local converters and regulators that are implemented on one or more IC chips will provide other working voltages as required. The converters and regulators may be programmable in order to adjust the working voltages for testing purposes.

The layout of circuit assembly 80 is so dense, both in the fine line traces and in the fine pitch assembly, that conventional connectors and cables are not well suited for interconnecting modules of this type; they would occupy a large fraction of the total module space. Consequently, part of the current invention is to provide an effective means for connecting circuit assemblies to testers, and circuit modules to other circuit modules or to other electronic systems employing different manufacturing methods. It is proposed that the same methods used to fabricate circuit assembly 80 can also be used to fabricate test fixtures and module cables.

Figure 11B:
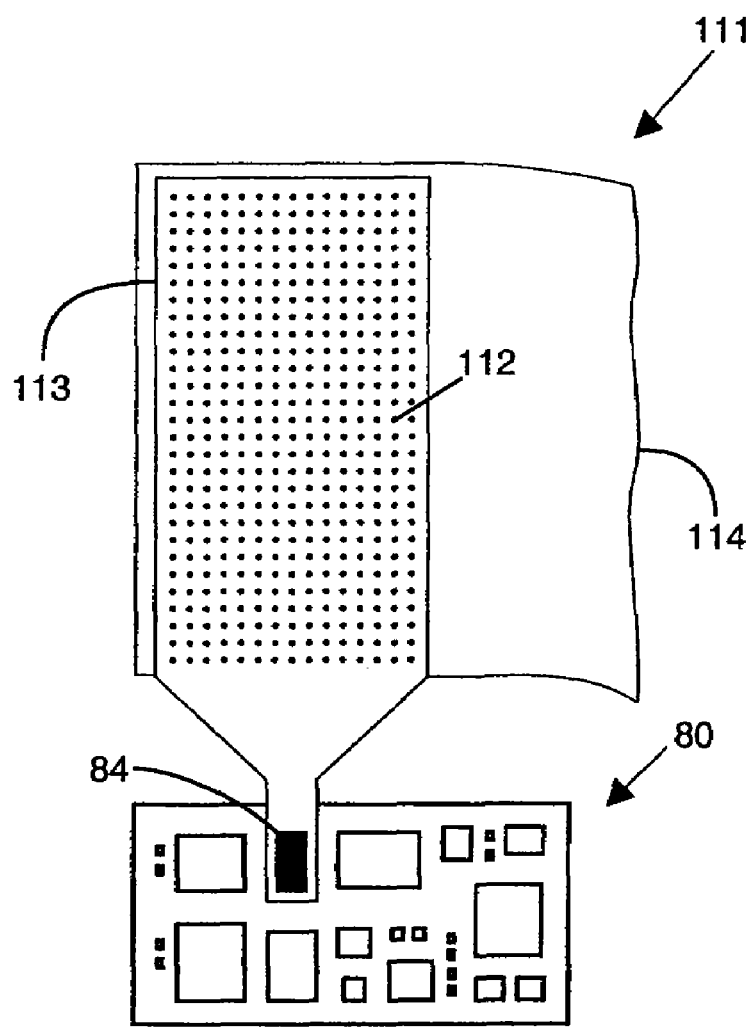
FIG. 11B shows a test fixture of the current invention, in relation to a circuit assembly.

In FIG. 11B, a test fixture 111 is shown connecting to module access port 84 of circuit assembly 80. A redistribution of the module access pads 112 is provided on glass substrate 113, so as to connect conveniently to an external device using a low cost cable 114 having relatively large features. For small arrays of module access pads, a single layer of aluminum may be patterned on glass substrate 113, with a one-to-one connection between module access pads in the module access port, and corresponding pads in the redistributed array. This can be accomplished (with no signal crossovers) if redistributed array 112 is a scaled mirror image of the module access pad array. For larger arrays, a multi-level interconnection circuit may be required. As previously described in reference to FIG. 9 for forming stud bumps on IC chips, so stud bumps may be formed at I/O pads on test fixture 111. They may be provided at a pad pitch of 100 microns or less at the small end containing the module access port, to mate with wells filled with solder at each of the module access pads. A conventional flexible circuit may be employed to connect an external device (such as a tester) to pads in redistributed array 112. Such a flex circuit may have copper conductors, and may include bumps that connect by contact pressure with pads of redistributed array 112. These pads may be enlarged for ease of alignment and robustness with respect to unmatched CTEs. They may also be plated with gold for a low-resistance contact. A primary purpose of test fixture 111 is to provide connection means for verifying the integrity of the multi-layer interconnection circuits before any components are assembled. Secondary purposes may include testing of the circuit assembly 80. If test chips are provided on the module, then test fixture 111 may be used to connect these chips to an external tester for verification. Connections to the module access port can be unmade in the same way that defective IC chips can be reworked, by heating the solder and withdrawing the stud bumps. Heat is applied using a hotplate under the glass carrier supporting circuit assembly 80 and hot inert gas is applied to a localized region on the topside of glass substrate 113. The hot gas is directed and confined so as to melt the solder associated with the targeted connector, and not the solder of neighboring components. After withdrawing the stud bumps from the wells the surface is inspected. Touchup may include cleaning of the area around the wells and addition of more solder paste to the wells. Then another connection to the module access port can be made for the same or a different purpose.

Figure 12:
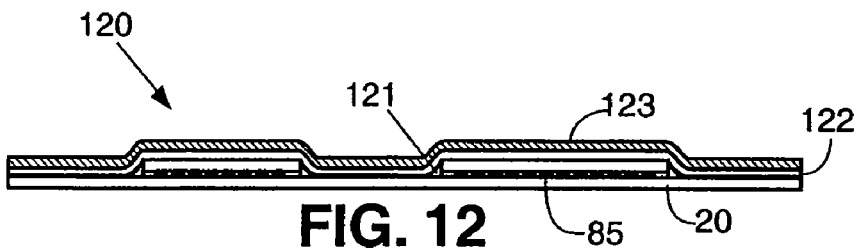
FIG. 12 is a cross-sectional view of a circuit assembly showing the first module level coatings.

Before permanently assembling a module cable to the circuit assembly, it is desirable to coat the top surface with a dielectric layer and a metal layer, as part of the process to create a hermetic or semi-hermetic module. The dielectric layer prevents shorting of components when the metal layer is subsequently applied. The metal layer provides a shield at the top surface, except for small holes at the module access pads, as will be further described in reference to FIG. 13. FIG. 12 shows a cross-sectional view like FIG. 8B except that some module level coatings have now been applied to evolve circuit assembly 80 into circuit assembly 120. At the edges of components, where vertical faces meet interconnection circuit 20, fillets 121 are shown. They provide support for dielectric coating 122 which is a thin passivating layer of Parylene in the preferred embodiment. The material of fillet 121 is silicone rubber or other inert material. It is applied by extruding a bead of the material, then following with a narrow spatula to shape the bead into a triangular cross-section. The fillet material is then cured, and dielectric film 122 and metal film 123 applied. Metal film 123 is the first topside module-level metal film. It provides a conductive coating in the region of the module access port, except for small openings at the module access pads. This area will not be covered by second module-level topside metal, because when that coating is deposited a module cable will be connected at the module access port and will block the deposition path, as will be further described in reference to FIG. 18A. Metal film 123 is preferably aluminum with a thickness of approximately one micron. Other metals and thicknesses can be used. One micron of aluminum provides good hermetic protection plus some electromagnetic shielding, at reasonable cost. Depending on the severity of the electromagnetic environment, it may be desirable to substantially increase the thickness for effective shielding performance.

Figure 13A:
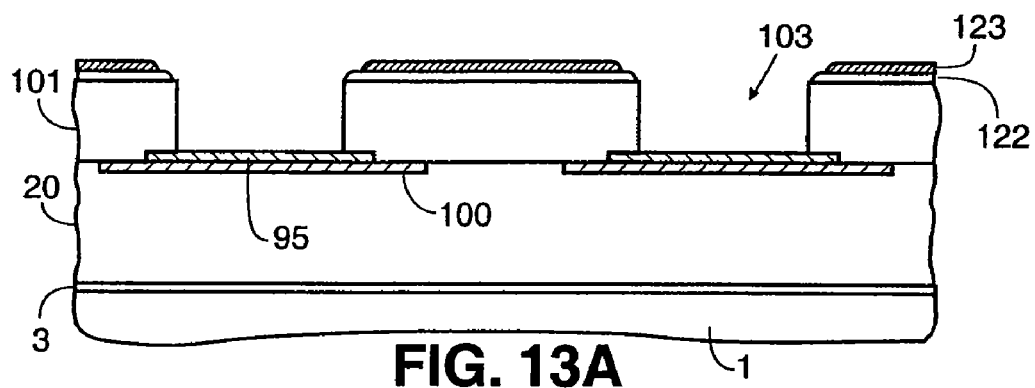
FIG. 13A-13C shows structural cross-sections that illustrate a preferred method for connecting a module cable or a test fixture to a circuit module.
Figure 13B:
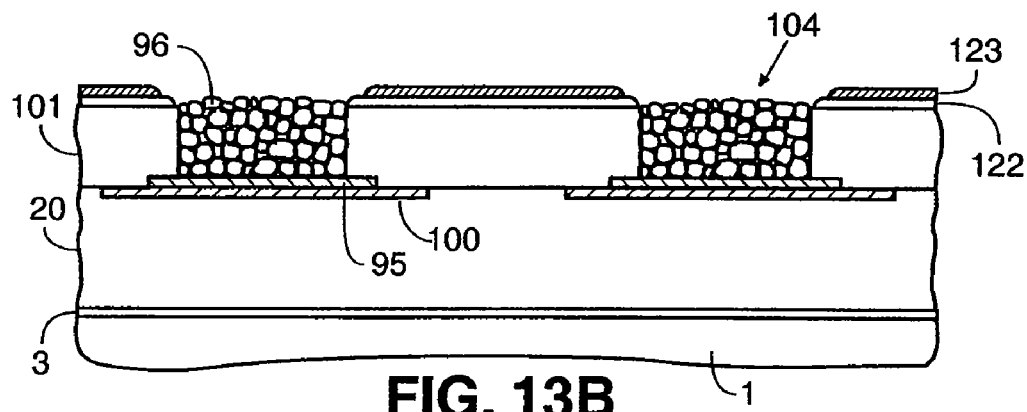
Figure 13C:
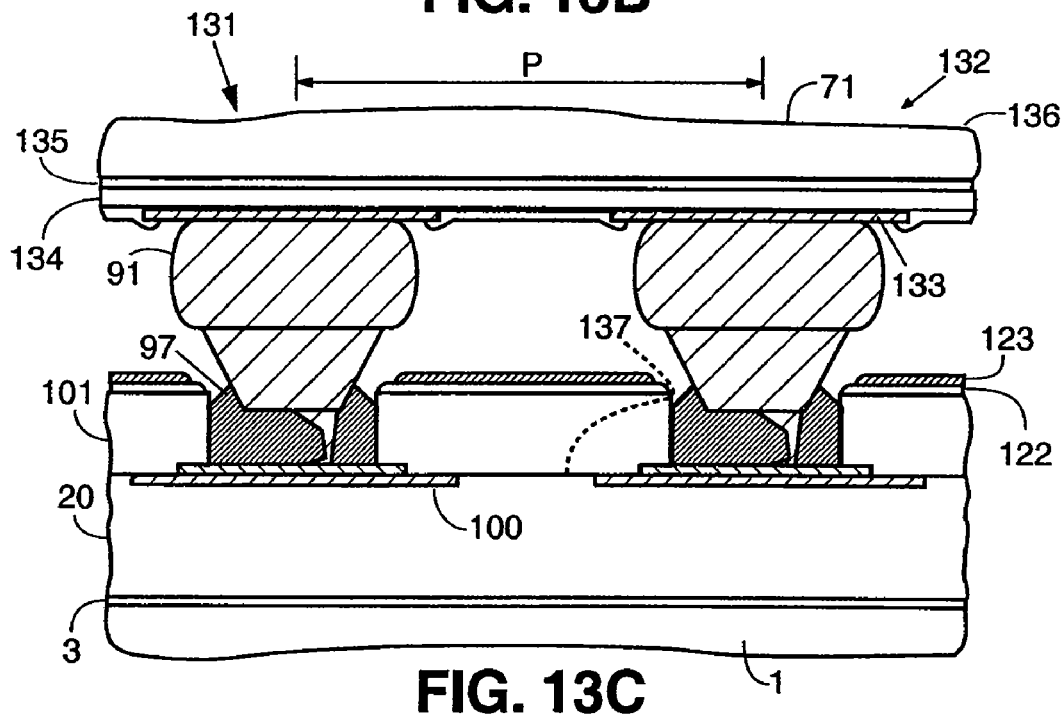

FIG. 13A-FIG. 13C show how the first topside module-level metal film is patterned near the module access pads of circuit module 120; they also show the similarity between flip chip connections 86 and 105 already described for attaching IC chips and module access port connections such as 131, shown in FIG. 13C. FIG. 13A shows multi-layer interconnection circuit 20 on release layer 3 on glass carrier 1. A flat I/O bonding pad 100 is shown, which in this case is a module access pad of module access port 84. Alternatively, if stacked contacts are provided at each I/O pad of module access port 84, then the indentations already provided by the stacked contacts may be employed for the wells, as described in reference to FIG. 9. Metallization 95 is shown over bonding pad 100, as previously described. The pitch between wells filled with solder 104 is 95 microns in the figure, with a preferred range of 60-200 microns. Module-level packaging layers 122 and 123 are also shown. Layer 122 is a passivating layer of Parylene, and layer 123 is a hermetic and shielding layer of metal as previously described. Opening 103 is patterned and filled with solder paste 96 to form well 104 as previously described. FIG. 13C shows an enlarged portion of a module cable 132 inverted over the wells; it is attached to glass carrier 136 for dimensional stability during assembly. Gold stud bumps 91 are bonded to metal pads 133 that sit on interconnection circuit 134 on top of release layer 135, on top of glass carrier 136 (inverted in the figure). Referring to the shape and size of multi-layer circuit 22 in FIG. 2, and understanding that a common manufacturing process may be used to fabricate circuit assemblies like 80 and module access cables like 132, it can be seen that 132, 135, and 136, may actually be the same as 22, 3, and 1, respectively. The path 137 for water to migrate into interconnection circuit 20 is shown. The surfaces surrounding the wells are coated with dielectric 122 and metal layer 123 to provide a barrier to water at the module access pads, in the area surrounding but not including the wells. The solder in the wells also provides an effective water barrier, leaving just a narrow entry point for water, and a long path 137 through polymer layer 101 in FIG. 13C. Polymer layer 101 provides a weak barrier to water. Thus the module access pads are semi-hermetic. Since the area of the module access port is typically small compared with the total surface area of the module, the total exposure to water is limited to a semi-hermetic portion of small extent.

Referring back to FIG. 8A, the assembly and test sequence of the electrical components such as IC chip 81 will now be discussed. Before assembling any components, a test fixture such as 111 is temporarily attached to module access port 84, with the other end connected to a tester. Multi-layer interconnection circuit 20 is tested for opens and shorts, and rejected if defective. The first chip to be assembled may be test chip 85. This chip is itself verified by an external tester with capabilities suitable for testing both its functional and parametric specifications. If defective, test chip 85 is replaced using the rework sequence previously described. Once installed and verified, the test chip is capable of testing the remaining components at circuit speed. Alternatively, a completed flip chip assembly like 80 may be tested using an external tester, connected using test fixture 111. If desired, testing can be performed at an elevated temperature applied to the entire circuit assembly, using a heater under the glass carrier. After the circuit assembly has been completely assembled and tested, the test assembly is removed so as not to obstruct the coating of an additional top surface metal layer, as further described in reference to FIG. 18A. The overall sequence for creating a tested circuit assembly is presented as a flow graph in FIG. 20.

Figure 14:
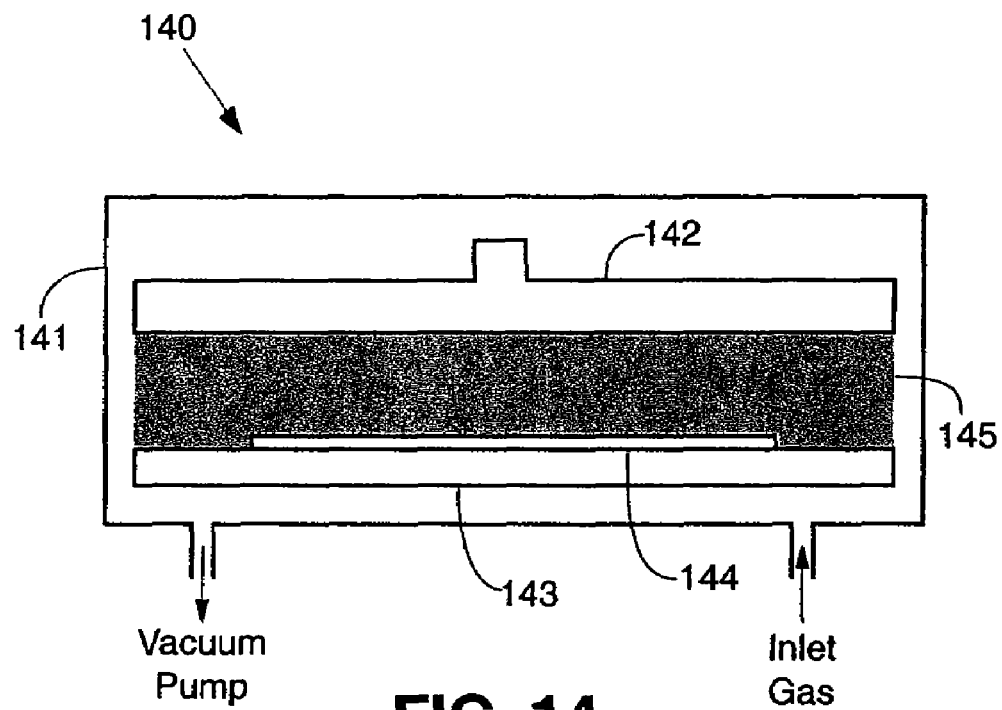
FIG. 14 is a schematic cross-sectional view of an RF sputtering machine.

FIG. 14 shows a conventional RF sputtering chamber 140, used for vacuum deposition of metal layers. Vacuum chamber 141 has an inlet port for a sputtering gas such as argon, and an exit port connected to a vacuum pump as shown. Chamber 141 includes a top electrode 142 that is connected to an RF source (not shown), and a counter electrode 143. The part to be coated 144 normally sits directly on counter-electrode 143.

During sputtering, a plasma 145 of ionized gas is formed between the top electrode and the counter-electrode as shown. These details are provided as background for a modification to this apparatus, further described in reference to FIG. 18A and 18B, wherein the counter-electrode is modified to include a pedestal.

Figure 15:
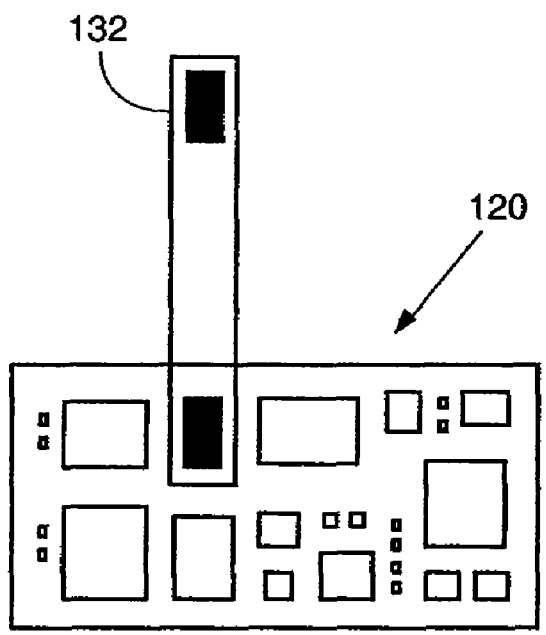
FIG. 15 is a plan view of a module cable of the current invention, connected to a circuit assembly.

FIG. 15 shows module cable 132 of the present invention, in plan view. It is connected to circuit module 120, before glass carrier 1 is removed to apply the bottom side metal.

Figure 16:
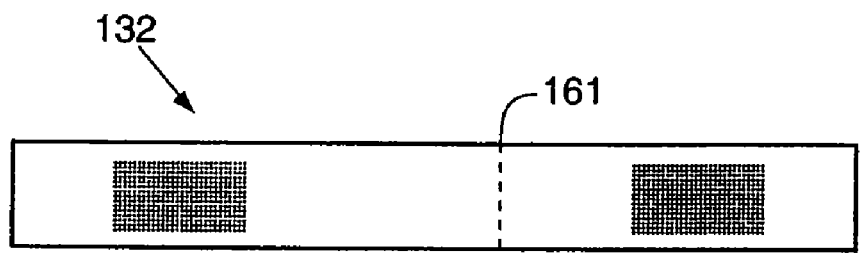
FIG. 16 shows a scribe mark on the glass carrier of a module cable.
Figure 17A:
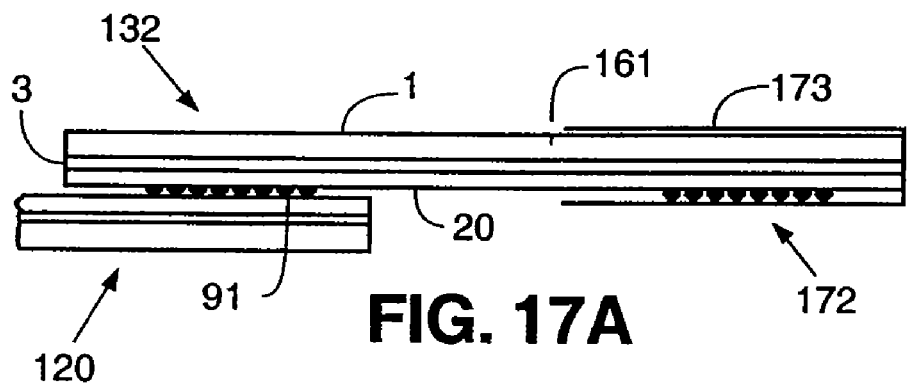
FIG. 17A-17C is a series of cross-sections depicting the process steps for connecting a module cable to a circuit assembly.
Figure 17B:
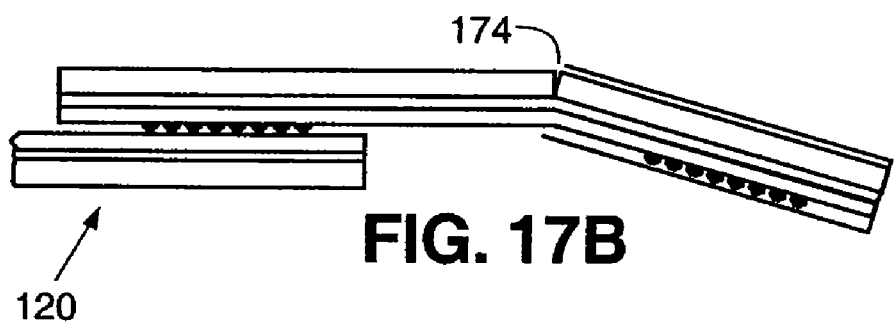
Figure 17C:
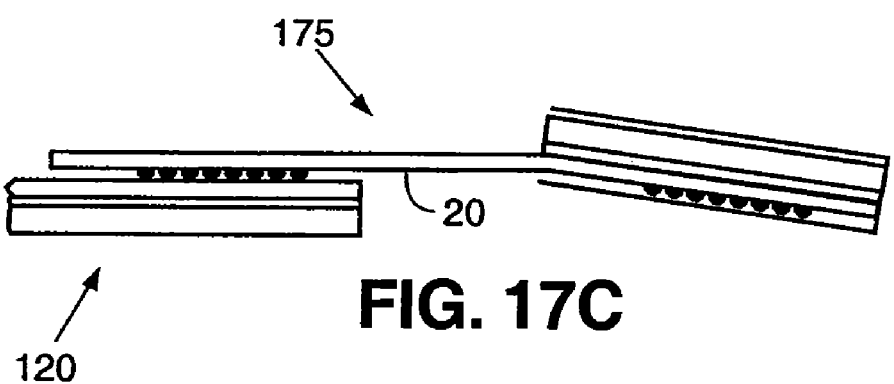

FIG. 16 shows module cable 132 with an array of module access pads at each end of the bottom surface (made visible in the figure for descriptive purposes). On the top surface, a scribe line 161 has been scored in the glass surface with a scribing tool, marking the place where the glass carrier will later be cracked into two separate pieces. Alternatively, scribe line 161 may be a shallow cut with a diamond saw, positively defining the location of the break to be made, while leaving enough glass thickness to provide adequate strength for handling. FIG. 17A through FIG. 17C shows the sequence for connecting one end of module cable 132 to circuit assembly 120. To maintain the necessary dimensional stability, it is critical that a glass carrier be present on both sides of the connection interface while the bond sites on both sides are aligned and the bonds are permanently created. In FIG. 17A, module cable 132 includes glass carrier 1 with release layer 3 as previously described, and a single or multi-layer interconnection circuit 20 with stud bumps 91 attached at each bonding pad of an array of module access pads. A similar array of stud bumps 172 is shown at the other end of module cable 132. Interconnection circuit 20 connects between I/O pads of the two arrays in a one-to-one relationship. A cover or sheath 173 protects the unused end of module cable 132, including the second array of gold stud bumps 172, until module 120 is connected to another circuit module, or to another electronic system. Module cable 132 can be envisaged in a more complex form, including three or more arrays of module access pads, with each array connecting to a circuit module, or to an electronic system other than a circuit module. One or more of the arrays of module access pads may be redistributed with a larger pad pitch for greater ease of connection to a particular piece of electronic equipment, as was described for test fixture 111. As previously described, when correct alignment has been achieved heat is applied to form permanent bonds between stud bumps on module cable 132 and corresponding wells filled with solder on circuit assembly 120; FIG. 17A shows module cable 132 attached to circuit assembly 120. This stud bump/well connection is preferably as described in FIG. 13C. FIG. 17B shows that a bending force has been applied, to crack the glass carrier into two pieces at scribe line 161. Crack 174 is shown. In FIG. 17C, one portion of glass carrier 1 has been removed by peeling the glass piece away from interconnection circuit 20, leaving behind interconnection circuit 20 attached to circuit assembly 120 at each of the module access pads. A module cable that is connected at one end is labeled 175.

Figure 18A:
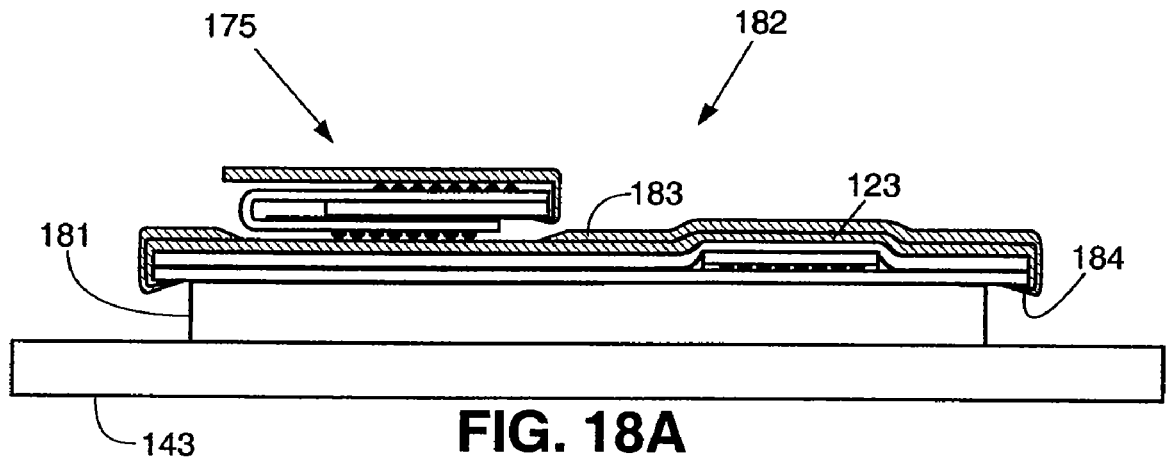
FIG. 18A shows a sputtering chamber arrangement for coating the second topside module-level metal layer.
Figure 18B:
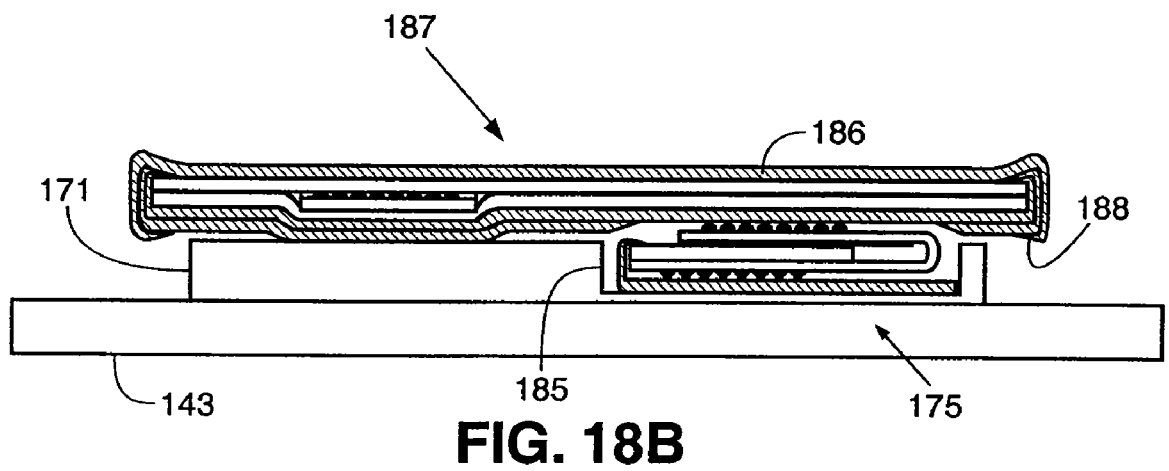
FIG. 18B shows a sputtering chamber arrangement for coating the bottom side module-level metal layer.

It is desired to create a continuous metal envelope around the circuit assembly including the interconnection circuit and the attached components, with only a small opening at each of the module access pads. For hermeticity and effective electromagnetic shielding it is critical that the top and bottom metal layers form an overlapping seam of continuous and void-free metal at the edge of the circuit assembly. A preferred method for achieving this is shown in FIG. 18A-18B. FIG. 18A shows counter-electrode 143 previously described in reference to FIG. 14; for convenience the other parts of RF sputtering chamber 140 are omitted in FIG. 18A-18B. Normally, a part to be coated in a sputtering chamber requires deposition on the top surface only and is placed directly on the counter electrode. In the current invention, counter electrode 143 is modified to include a pedestal 181 that provides an air gap of a few millimeters between circuit assembly 182 and the opposing surface of the counter electrode. The effect of this arrangement is that the second top layer metal film 183 will also coat around the edge of the circuit assembly with a thickness that tapers to zero, 184, underneath circuit assembly 182. Circuit assembly 182 corresponds to section YY of FIG. 8A. The preferred metal film 183 is aluminum, with a thickness of one micron, that adds to the first module-level metal film 123, also with a thickness of one micron. Module cable 175 is folded to create a minimum footprint blocking the path of deposited metal to circuit assembly 182. After the second top layer metal film 183 has been deposited, the circuit assembly is flipped on pedestal 181 as shown in FIG. 18B. A cutout 185 is provided in pedestal 181 to store module cable 175, in a manner that leaves the edges of circuit module 182 exposed for coating. After deposition of bottom side metal 186, circuit assembly 182 becomes circuit module 187, with the name "module" implying a complete envelope of conductive material. Again, the coating extends around the edges, 188. The net result is a continuous metal film covering the topside, the bottom side, and the edges, to form a complete envelope around the circuit assembly. An alternative method for creating a metal layer with a coating that extends around the edge like 188 is to use a vacuum evaporator. In this case the circuit assembly is held on a carousel, and the carousel executes a planetary motion with respect to the evaporation source to effect coating of a substrate from many different angles, as is known in the art.

Figure 19:
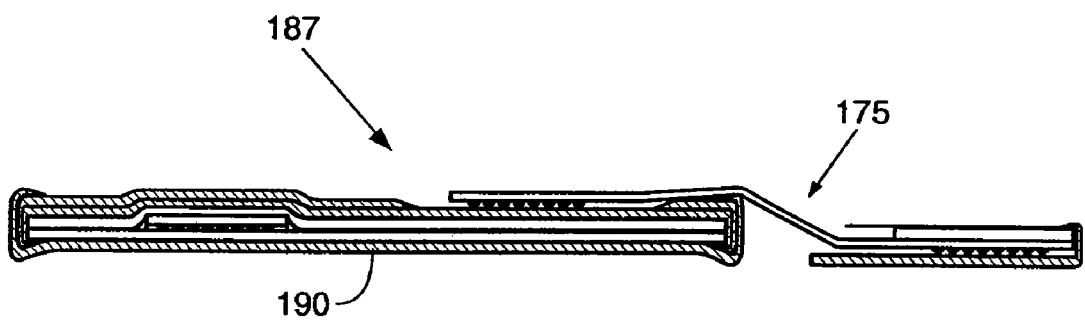
FIG. 19 is a cross-sectional view of a system module with attached module cable of the current invention.

FIG. 19 shows system module 187 of the current invention after withdrawal from the sputtering chamber, with all processing completed. The interconnection circuit and attached components of module 187 have been thoroughly tested as an integrated system. Module 187 includes a conductive envelope 190 comprised of multiple overlapping coatings. Conductive envelope 190 continuously covers the module except for small openings at the module access pads. Module cable 175 is attached using fine pitch connections. Conductive envelope 190 provides a hermetic seal. It also provides an effective electrical screen for reducing electromagnetic interference between the module and other electronic components. It reduces electromagnetic radiation, EMR, produced by the module and also reduces electromagnetic susceptibility, EMS, by reducing the effect of external electromagnetic waves on circuits within the module. With its carrier removed module 187 is flexible except that it may be constrained by assembled components that are rigid.

Figure 20A:
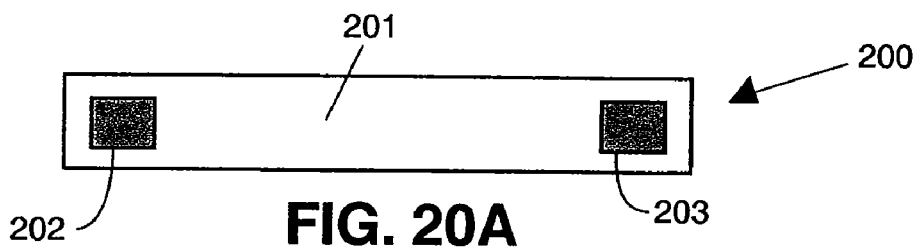
FIG. 20A is a top view of a cable of the present invention with an input port and an output port.
Figure 20B:
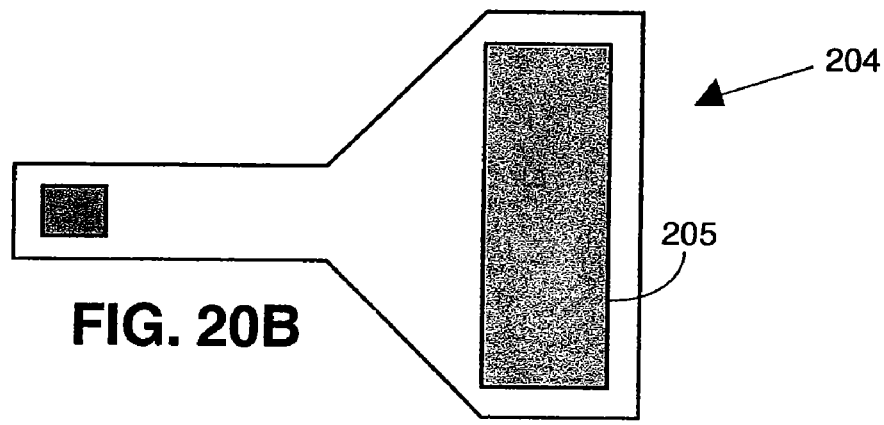
FIG. 20B shows a cable having a port with a redistributed array of input/output pads.
Figure 20C:
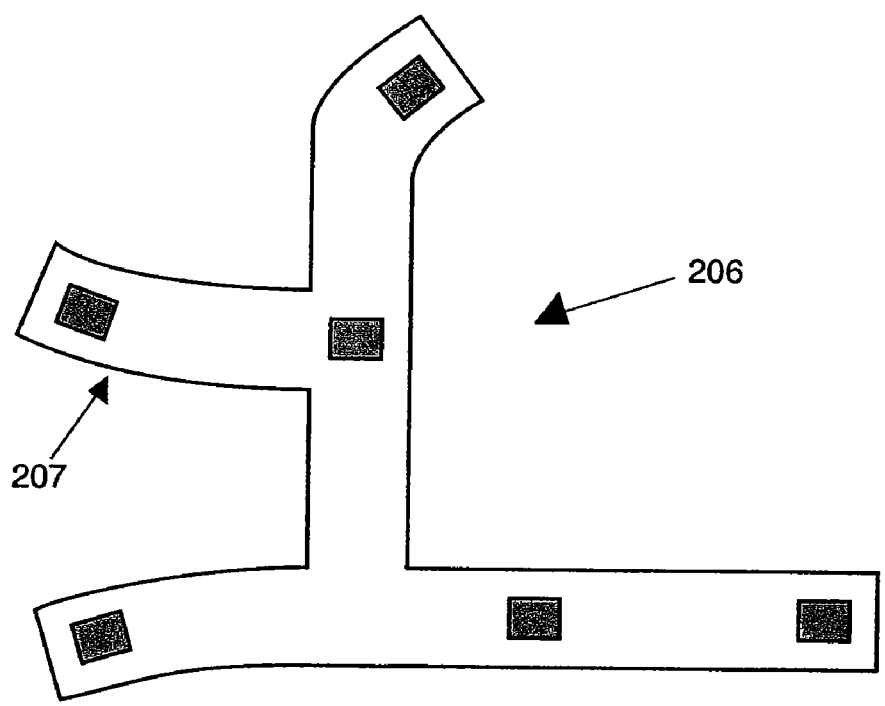
FIG. 20C shows a cable with multiple fingers and multiple ports.

FIG. 20A-20C show various cables of the current invention. FIG. 20A is a simple cable comprising an interconnection circuit having multiple traces 201 connected at one end to port 202 and at the other end to port 203. Interconnection circuit 201 may have a single layer of conductors, or multiple layers as described in reference to FIG. 3 and 4. Port 202 may be an input port comprising all of the input signals to the cable, and port 203 may be an output port comprising a matching set of output signals from the cable. Signals may also be bidirectional in some applications, so that a port may consist of mixed input and output signals. Also the ports can be implemented with either gender on the cable side; all that is required is that there are bumps on one side of the connection and wells on the other side, and this is generally true for all of the cables of the current invention. Within a single cable, some ports may consist of bumps and other ports of wells. The wells can be fabricated as described in reference to FIG. 10C, for example. FIG. 20B shows a cable 204 wherein port 205 has been expanded using a redistribution array similar to the redistribution array described in reference to FIG. 11B, to allow greater spacing between the I/O pads. This may simplify the task of attaching to an external component or system having a different set of pad spacing requirements. FIG. 20C shows a cable 206 with multiple fingers 207, each finger having one or more ports.

Figure 21:
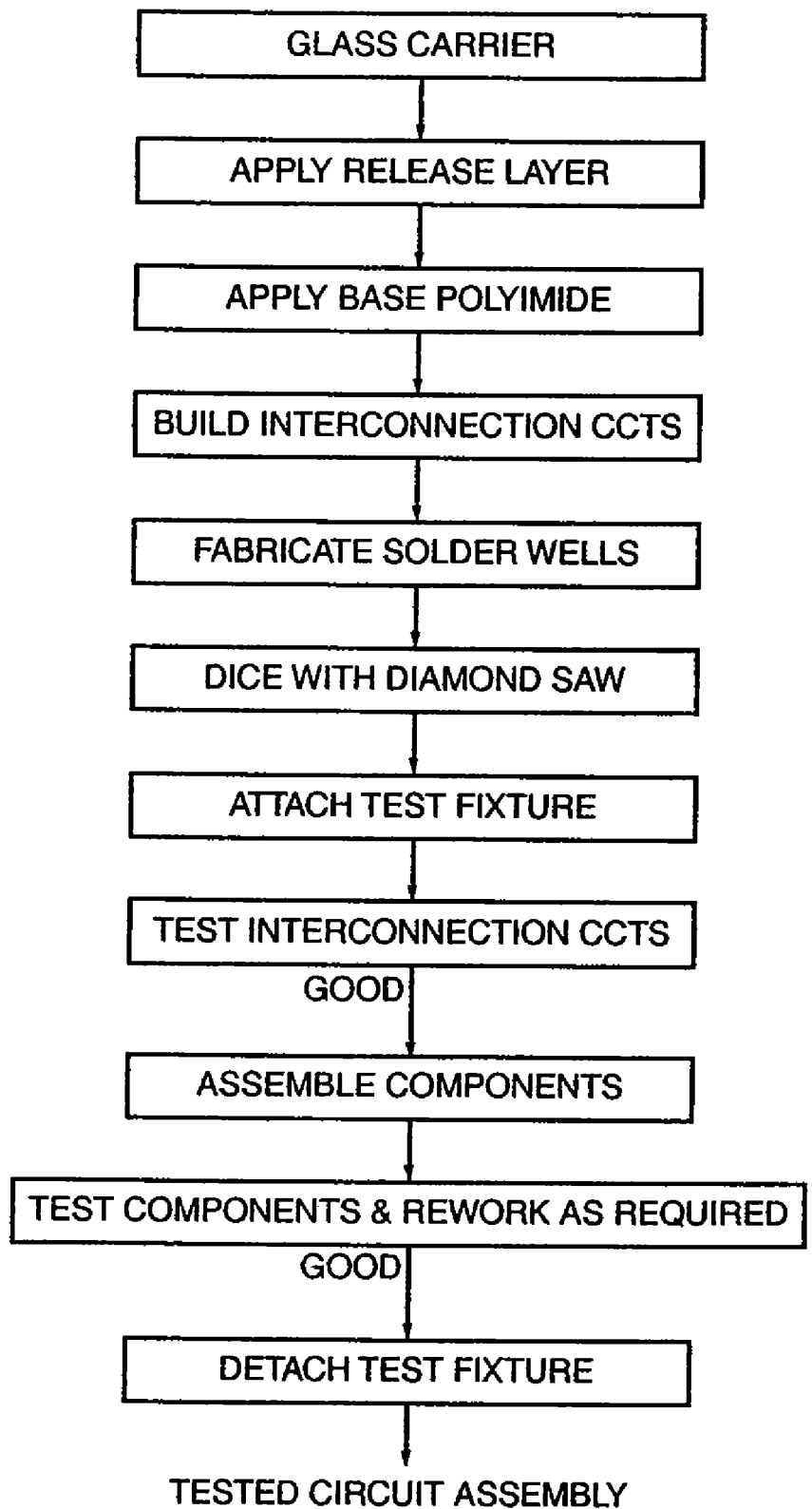
FIG. 21 is a flow chart summary of the process steps to create a tested circuit assembly.

FIG. 21 shows a summary in the form of a flow chart of the aforementioned process for constructing a circuit assembly of the present invention. If adequate depressions are formed by making stacked contacts at each I/O pad, then a separate step for fabricating the solder wells may not be required.

Figure 22:
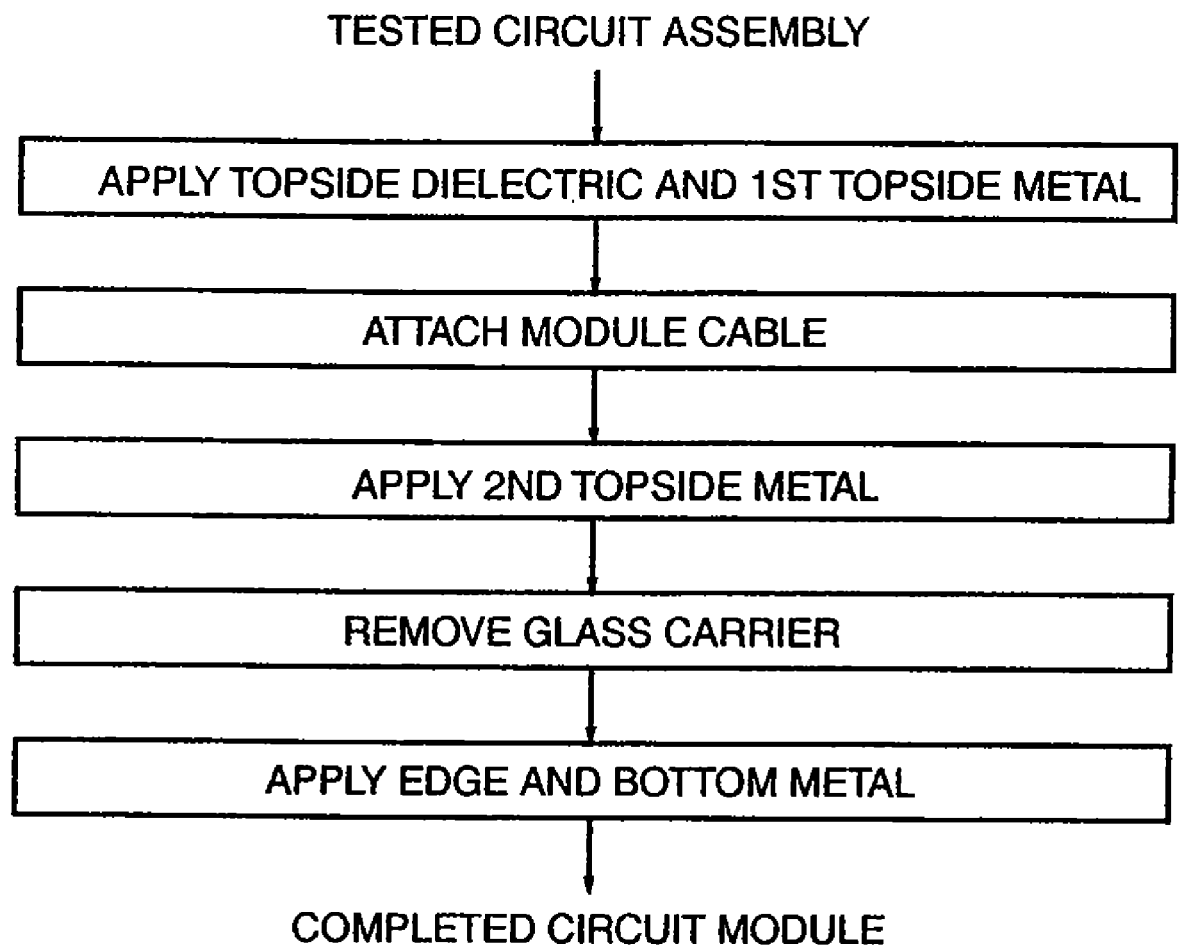
FIG. 22 is a flow chart summary of the additional steps to convert a tested circuit assembly into a completed circuit module.

FIG. 22 shows a summary in the form of a flow chart of the aforementioned process for constructing a system module from a circuit assembly, where the module includes a module cable (if required) and a surrounding envelope of conducting material.

Figure 23:
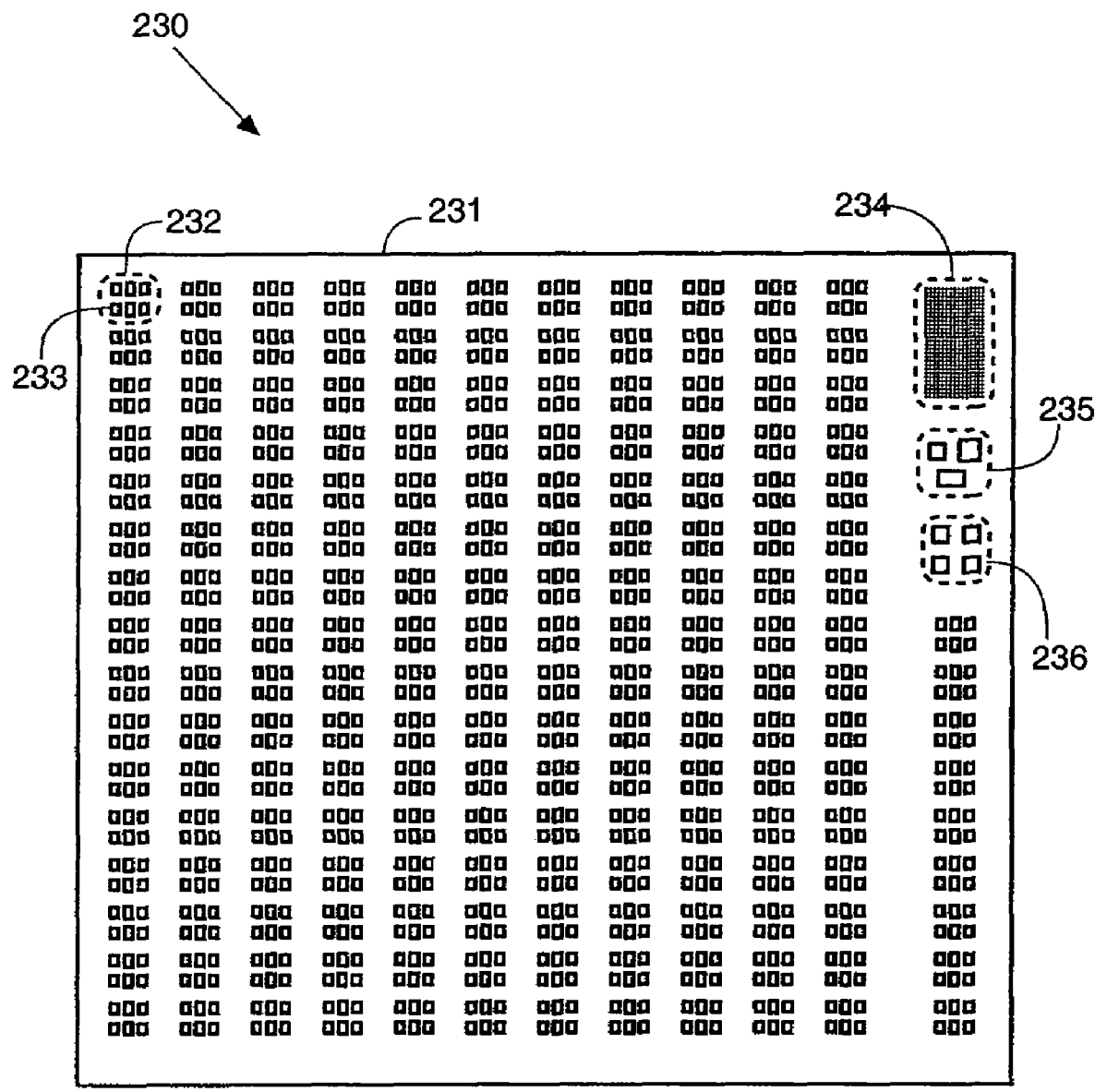
FIG. 23 is a plan view of a blade server component of the current invention.

FIG. 23 shows an alternative embodiment of a circuit assembly, such as for a blade server component, 230, of the current invention. A single large-interconnection circuit 231 contrasts with the array of smaller interconnection circuits 20 shown in FIG. 2. Processing groups of IC chips 232 are arrayed as shown, including individual IC chips such as 233. Each processing group may include processor chips, memory chips, and bus-interface chips, for example. The dense interconnection circuits and assembly methods of the current invention provide for a large computational capability on circuit assembly 230. A module access port 234 similar to 84 is shown, for connecting to other systems, including test systems. A group of special-purpose programmable test chips is provided, 235, and also a maintenance group of IC chips 236, for maintenance of the blade server. For example, any failure occurring in a processing group may be automatically detected by a background process running on maintenance group 236, which will reconfigure blade server component 230 to bypass the defective group for any further operations.

Figure 24:
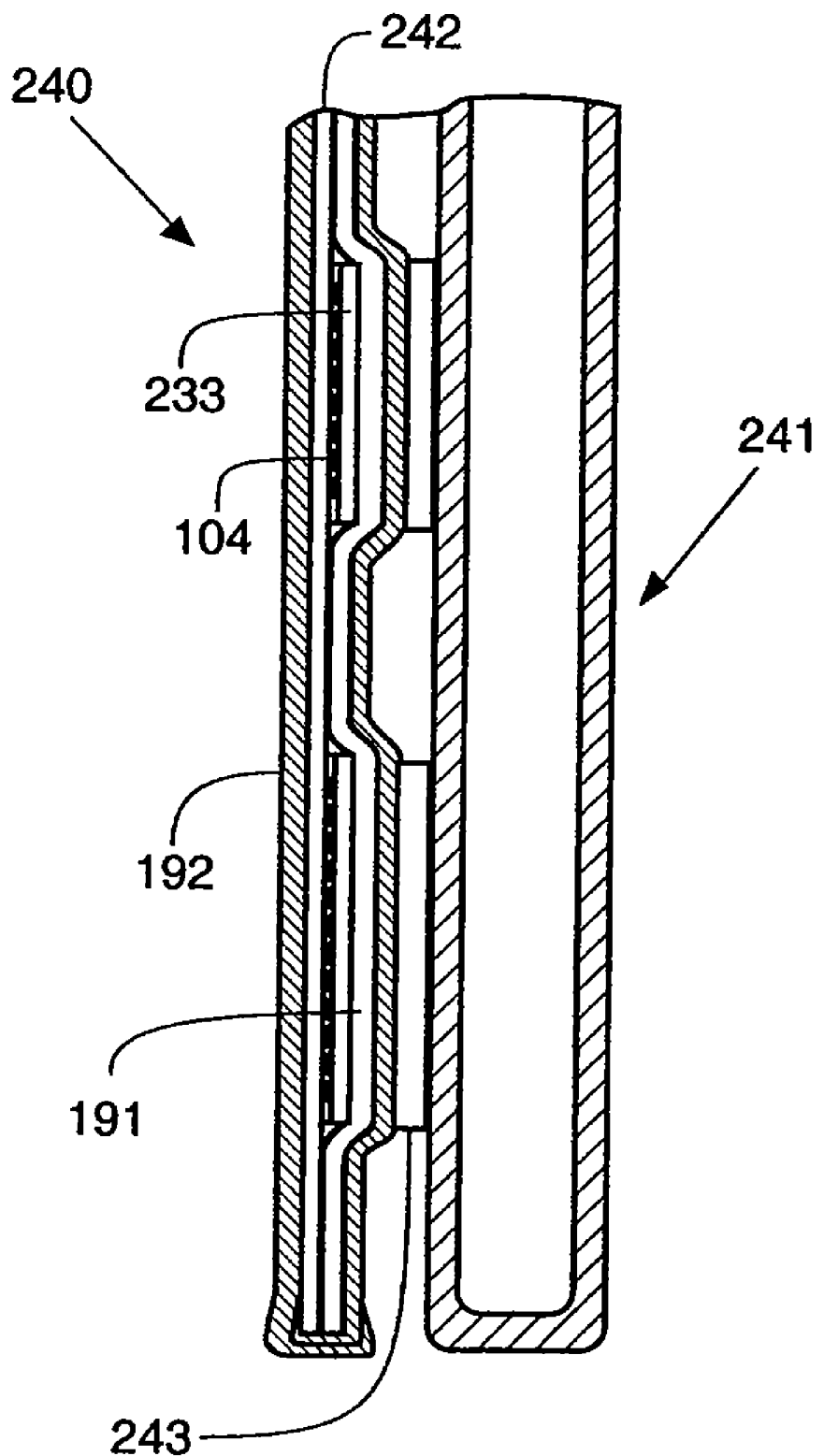
FIG. 24 is a cross-sectional view of an edge fragment of a circuit module attached to a heat sink.

In FIG. 24, circuit assembly 230 has been converted into circuit module 240 by application of module-level coatings, as previously described. FIG. 24 shows an edge fragment of circuit module 230 coupled with a heat sink 241. Circuit module 240 includes multi-layer interconnection circuit 242 which may differ from interconnection circuit 20 because it is configured for high-speed operation using differential signal pairs, for example. IC chips such as 243 are preferably attached using flip chip bonds such as 105, previously described. Similarly, module-level coatings including dielectric layer 191 and conductive envelope 192 are fabricated using the same methods as previously described for circuit module 190. Circuit module 240 is attached to heat sink 241 at the faces of chips such as 233, using a layer of thermal material 243 at each attached IC chip. Material 243 may be thermal grease or a conductive epoxy, and may be applied by printing as a thick film onto the top surface of module 240. Heat sink 241 preferably contains a recirculating coolant fluid, to extract heat effectively using a heat sink of small volume. Circuit module 240 and heat sink 241 may be combined to form a blade server component that can be inserted into a server chassis, with appropriate provisions for electrical and plumbing connections. The thermal path from active transistor junctions on IC chips such as 233 to heat sink 241 has low thermal impedance. It includes only one layer of non-conducting material, which is preferably a thin layer of Parylene 191 in the current invention. This means that IC chips of blade server module 240 can operate at high power levels, without exceeding their maximum junction temperature specifications.

What is claimed is:

1. A method for fabricating an electronic circuit comprising the steps of:
    providing a rigid carrier;
    applying a base dielectric layer on said rigid carrier;
    fabricating one or more interconnection circuits having exposed input/output pads on said base layer;
    fabricating wells at said input/output pads of said interconnection circuits; and
    filing said wells with conductive bonding material; and
    attaching electronic components formed on a different carrier to said interconnection circuits to form an electronic assembly; wherein each of said components has a conductive bump at each of its input/output pads, and each of said conductive bumps is inserted into said conductive bonding material of one of said wells.

2. The method of claim 1 and including the step of fabricating a release layer interposed between said rigid carrier and said base dielectric layer.

3. The method of claim 2 and including the step of separating said interconnection circuit or electronic assembly from said rigid carrier at said release layer, after completing said circuit or assembly.

4. The method of claim 3 wherein said interconnection circuits comprise multiple dielectric and conducting layers.

5. The method of claim 2 wherein said release layer is not present near the edges of said rigid carrier, to provide an edge region of strong adhesion between said base dielectric layer and said rigid carrier.

6. The method of claim 5 wherein said release layer is additionally not present in streets at the periphery of a plurality of said interconnection circuits.

7. The method of claim 1 wherein said wells are filled with said conductive bonding material using a squeegee.

8. The method of claim 1 further comprising:
    forming a beard on each conductive bump adapted to make a contact with an associated input/pad when the conductive bump is inserted into the well associated therewith.

9. A method for forming wells filled with conductive bonding material on an interconnect circuit comprising the steps of:
    applying a layer of dielectric material on top of said interconnect circuit;
    forming openings in said dielectric layer at each input/output pad of said interconnect circuit; and
    depositing said conductive bonding material in said openings to form wells filled with conductive material; and
    attaching electronic components formed on a carrier to said interconnection circuits to form an electronic assembly; wherein each of said components has a conductive bump at each of its input/output pads, and each of said conductive bumps is inserted into said conductive bonding material of one of said wells.

10. The method of claim 9 wherein said conductive bonding material is deposited in said openings using a squeegee.

11. The method of claim 9 further comprising:
    forming a beard on each conductive bump adapted to make a contact with an associated input/pad when the conductive bump is inserted into the well associated therewith.

12. A method for assembling an integrated circuit chip having input/output pads on an interconnection circuit having bonding sites corresponding to said input/output pads comprising the steps of:

provideing a conductive bump at each of said input/output pads formed on a first carrier;

fabricating wells filled with solder at each of said bonding sites formed on a second carrier;

inserting said conductive bumps of said first carrier into said wells filled with solder; and heating and cooling said solder to make permanent connections; and forming a beard on each conductive bump adapted to make a contact with an associated input/pad when the conductive bump is inserted into the well associated therewith.

13. The method of claim 12 wherein said interconnection circuit is flexible.

* * * * *